US009029949B2

(12) United States Patent
Gambino et al.

(10) Patent No.: US 9,029,949 B2
(45) Date of Patent: May 12, 2015

(54) SEMICONDUCTOR-ON-INSULATOR (SOI) STRUCTURES WITH LOCAL HEAT DISSIPATER(S) AND METHODS

(71) Applicant: International Business Machines Corporation, Armonk, NY (US)

(72) Inventors: Jeffrey P. Gambino, Westford, VT (US); Qizhi Liu, Lexington, MA (US); Zhenzhen Ye, South Burlington, VT (US); Yan Zhang, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/036,158

(22) Filed: Sep. 25, 2013

(65) Prior Publication Data
US 2015/0084128 A1    Mar. 26, 2015

(51) Int. Cl.
*H01L 27/12*     (2006.01)
*H01L 21/00*     (2006.01)
*H01L 23/34*     (2006.01)
*H01L 21/283*    (2006.01)

(52) U.S. Cl.
CPC .............. *H01L 23/34* (2013.01); *H01L 21/283* (2013.01)

(58) Field of Classification Search
CPC ............................. H01L 23/34; H01L 21/283
USPC .......................................... 257/347; 438/122
See application file for complete search history.

(56) References Cited

U.S. PATENT DOCUMENTS

| | | | |
|---|---|---|---|
| 5,726,844 A | 3/1998 | Smith | |
| 6,242,778 B1 | 6/2001 | Marmillion et al. | |
| 6,424,009 B1 | 7/2002 | Ju | |
| 6,476,483 B1 | 11/2002 | Adler et al. | |
| 6,483,147 B1 | 11/2002 | Lin | |
| 7,015,078 B1 | 3/2006 | Xiang et al. | |
| 7,402,866 B2 * | 7/2008 | Liang et al. | 257/347 |
| 8,148,728 B2 * | 4/2012 | Or-Bach et al. | 257/67 |

(Continued)

FOREIGN PATENT DOCUMENTS

EP       2 454 752       5/2012

OTHER PUBLICATIONS

Kumar, et al., "Investigation of a new modified source/drain for diminished self-heating effects in nanoscale MOSFETs using computer simulation," Physica E 33, 2006, pp. 134-138.

(Continued)

*Primary Examiner* — William D Coleman
(74) *Attorney, Agent, or Firm* — Gibb & Riley, LLC

(57) ABSTRACT

Disclosed are semiconductor-on-insulator (SOI) structures comprising an SOI device (e.g., an SOI metal oxide semiconductor field effect transistor (MOSFET)) with local heat dissipater(s). Each heat dissipater comprises an opening, which is adjacent an active region of the SOI device, which extends through the insulator layer on which the SOI device sits to the semiconductor substrate below, and which is at least partially filled with a fill material. This fill material is a thermal conductor so as to dissipate heat generated by the SOI device and is also an electrical isolator so as to minimize current leakage. In the case of MOSFET, the local heat dissipater(s) can be aligned below the source/drain extension(s) or the source/drain(s). Alternatively, the local heat dissipater(s) can be aligned below the channel or parallel and adjacent to opposing sides of the channel. Also disclosed herein are methods of forming these SOI structures.

22 Claims, 30 Drawing Sheets

(56) References Cited

U.S. PATENT DOCUMENTS

| | | | |
|---|---|---|---|
| 8,298,904 | B2 | 10/2012 | Lukaitis et al. |
| 8,373,230 | B1 | 2/2013 | Or-Bach et al. |
| 2002/0185685 | A1 | 12/2002 | Ju et al. |
| 2005/0241801 | A1* | 11/2005 | Mitchell et al. ............... 165/80.3 |
| 2007/0045657 | A1 | 3/2007 | Kanemoto |
| 2009/0152630 | A1 | 6/2009 | Hayashi |
| 2013/0001655 | A1 | 1/2013 | Huang et al. |
| 2014/0191322 | A1* | 7/2014 | Botula et al. .................. 257/347 |

OTHER PUBLICATIONS

Dallmann, et al., "Scaling Constraints Imposed by Self-Heating in Submicron SOI MOSFET's," IEEE Transactions on Electron Devices, vol. 42, No. 3, Mar. 1995, pp. 489-496.

Chu, P.K., "Novel Silicon-on-Insulator Structures for Reduced Self-Heating Effects," IEEE Circuits and Systems Magazine, Fourth Quarter 2005, pp. 18-29.

Cole, et al., "A Method to Overcome Self-Heating Effects in SOI MOSFETs," IEEE, 2003, pp. 295-297.

Roig, et al., "Study of Novel Techniques for Reducing Self-Heating Effects in SOI Power LDMOS," Solid-State Electronics, vol. 46, 2002, pp. 2123-2133.

Khan, et al., "High Rate Etching of AlN Using BCl3/Cl2/Ar Inductivley Coupled Plasma," Materials Science and Engineering B95, 2002, pp. 51-54.

Guerrero, et al., "Growth of AlN Films by Chemical Vapor Deposition," Superficies γ Vacio 9, Dec. 1999, pp. 82-84.

Chen, et al., "Dry Etching of AlN Films Using the Plasma Generated by Fluoride," Vacuum, vol. 83, 2009, pp. 282-285.

Rice, et al., "Homoepitaxial Deposition of AlN on (0001)-Oriented AlN Substrates by MOCVD," NC State University, 2010, 1 page.

Reid, et al., "Amorphous (Mo, Ta, or W)-Si-N Diffusion Barriers for Al Metallizations," J. Appl. Phys. 79(2), Jan. 15, 1996, pp. 1109-1115.

Vasileska, et al., "Current Progress in Modeling Self-Heating Effects in FD SOI Devices and Nanowire Transistors," Journal of Computational Electronics, Sep. 2012, vol. 11, Issue 3, Sep. 2012, pp. 238-248.

Baine, et al., "Thermal Vias for SOI Technologies," Proceeding of the International Conference on Communications, Computers and Devices (ICCCD), vol. 1, Dec. 2000, pp. 239-242.

* cited by examiner

| Materials | Electrical Conductivity $(\Omega \cdot m)^{-1}$ | Thermal Conductivity ($W/mK$) |
|---|---|---|
| Silicon (Si) | ~ $10^{-3}$ | ~ 149 |
| Silicon Oxide ($SiO_2$) | ~ $10^{-18}$ | ~ 1.38 |
| Sapphire | ~ $10^{-16}$ | ~ 41.9 |
| Aluminum Nitride (AlN) | ~ $10^{-14}$ | ~ 285 |
| Beryllium Oxide (BeO) | ~ $10^{-15}$ | ~ 330 |
| Alumina or Aluminum Oxide (AlO) | ~ $10^{-14}$ | ~ 40 |

FIG. 3

SEMICONDUCTOR-ON-INSULATOR (SOI) STRUCTURES WITH LOCAL HEAT DISSIPATER(S) AND METHODS

BACKGROUND

The present disclosure relates to semiconductor-on-insulator (SOI) structures and, more particularly, to SOI structures with local heat dissipater(s) and methods of forming the SOI devices.

Typically, with bulk semiconductor devices, heat that is generated internally during device operation (i.e., heat generated due to the self-heating effect) can dissipate quickly through the bulk semiconductor substrate and, thus, has little impact on device performance. However, with semiconductor-on-insulator (SOI) devices, the poor thermal conductivity of the buried insulator layer (e.g., the buried silicon oxide ($SiO_2$) layer) on which the SOI devices sit limits the dissipation of heat generated during device operation. This lack of heat dissipation can cause, for example, a low saturation current, a limited maximum allowable frequency, a reduced lifespan, etc. Furthermore, as the size of SOI devices continues to be scaled, the negative impacts of the lack of heat dissipation can be exacerbated. Various different techniques have been suggested to provide heat dissipation for SOI devices. However, these techniques tend to increase the manufacturing costs and complexity, increase power consumption, and/or result in current leakage. Therefore, there is a need in the art for SOI devices with heat dissipation features and methods of forming such SOI devices at a low manufacturing cost and high efficiency.

SUMMARY

In view of the foregoing, disclosed herein are semiconductor-on-insulator (SOI) structures comprising an SOI device (e.g., an SOI metal oxide semiconductor field effect transistor (MOSFET) or other SOI device) with one or more local heat dissipaters (also referred to herein as thermal vias (TVs)). Each local heat dissipater can comprise an opening, which is adjacent to an active region of the SOI device, which extends through the insulator layer on which the SOI device sits to the semiconductor substrate below, and which is at least partially filled with a pre-selected fill material. This fill material can be a thermal conductor so as to dissipate heat generated by the SOI device into the semiconductor substrate in order to passively cool the SOI device. The fill material can further be an electrical isolator so as to minimize current leakage from the SOI device to the semiconductor substrate. In the case of a MOSFET, the local heat dissipater(s) can be aligned below the source/drain extension(s) or the source/drain(s) of the MOSFET. Alternatively, the local heat dissipater(s) can be aligned below the channel of the MOSFET or parallel and adjacent to side(s) of the channel of the MOSFET. Also disclosed herein are methods of forming these SOI structures.

More particularly, disclosed herein are semiconductor-on-insulator (SOI) structures. Each SOI structure can comprise a semiconductor substrate and an insulator layer on the semiconductor substrate. Each SOI structure can further comprise a semiconductor layer on the insulator layer and, within the semiconductor layer, an active region of a semiconductor device (e.g., an active region of a metal oxide semiconductor field effect transistor (MOSFET), a junction field effect transistor (JFET), a bipolar junction transistor (BJT), a heterojunction bipolar transistor (HBT), a diode, or another semiconductor device). The active region of the semiconductor device can, for example, be positioned laterally adjacent to a shallow trench isolation region. Each SOI structure can also further comprise one or more local heat dissipaters (i.e., one or more local thermal vias (TVs)) for dissipating heat from the active region of the semiconductor device and, particularly, from a specific component in the active region of the semiconductor device through the insulator layer to the semiconductor substrate below.

Each local heat dissipater can comprise an opening that extends through the insulator layer to the semiconductor substrate below. Each opening can be aligned below the active region of the semiconductor device and, particularly, aligned below a specific component of the active region of the semiconductor device. Alternatively, each opening can extend through the shallow trench isolation region as well as the insulator layer and can be positioned laterally adjacent and parallel to the active region of the semiconductor device and, particularly, positioned laterally adjacent and parallel to a specific component of the active region of the semiconductor device.

Each local heat dissipater can further comprise a fill material that at least partially fills the opening such that, within the opening, the fill material is immediately adjacent to the semiconductor substrate and also adjacent to the active region of the semiconductor device and, particularly, adjacent to a specific component in the active region. The fill material can be selected for its thermally conductive and electrically isolative properties. Specifically, the fill material can be more thermally conductive than the insulator layer so as to allow heat, which is generated in the active region of the SOI device, to dissipate from the semiconductor layer through the insulator layer by way of the local heat dissipater and into the semiconductor substrate, thereby passively cooling the SOI device. The fill material can further be less electrically conductive that the semiconductor layer and the semiconductor substrate so as to minimize current leakage from semiconductor layer to the semiconductor substrate.

In the case where the semiconductor device comprises a MOSFET, the active region of the MOSFET can comprise a channel, source/drain extensions positioned laterally adjacent to the channel, and source/drains positioned laterally adjacent to the source/drain extensions opposite the channel. Opening(s) containing fill material for local heat dissipater(s) can extend through the insulator layer to the semiconductor substrate below and can be aligned below the source/drain extensions or aligned below the source/drains. Alternatively, one or more openings containing fill material for local heat dissipaters can extend through the insulator layer to the semiconductor substrate below and can be aligned below the channel. Alternatively, opening(s) containing fill material for local heat dissipater(s) can extend through the shallow trench isolation region and the insulator layer to the semiconductor substrate below and can be positioned laterally adjacent and parallel to opposing sides of the channel.

Also disclosed herein are methods of forming semiconductor-on-insulator (SOI) structures having an SOI device with one or more local heat dissipaters.

One method of forming an SOI structure, having an SOI device with one or more local heat dissipaters, begins with a semiconductor substrate. An insulator layer can be formed on the semiconductor substrate.

Then, at least one local heat dissipater can be formed in the insulator layer. For each local heat dissipater, an opening can be formed that extends through the insulator layer to the semiconductor substrate below. The fill material can be selected for its thermally conductive and electrically isolative properties. Specifically, the fill material can be more thermally conductive than the insulator layer and less electrically conductive than the semiconductor substrate and a semiconductor layer to be subsequently formed on the insulator layer. After the fill material is deposited, it can be etched back to at least the level of the top surface of the insulator layer, thereby creating the local heat dissipater(s) within the insulator layer.

Next, a semiconductor layer can be formed on the insulator layer. Then, additional processing can be performed in order to form a semiconductor device (e.g., a metal oxide semiconductor field effect transistor (MOSFET), a junction field effect transistor (JFET), a bipolar junction transistor (BJT), a heterojunction bipolar transistor (HBT), a diode, or another semiconductor device) having an active region within the semiconductor layer. The semiconductor device should specifically be formed such that the local heat dissipater(s) are aligned below and adjacent to the active region of the semiconductor device and, particularly, aligned below and adjacent to specific component(s) of the active region of the semiconductor device.

For example, in the case where the semiconductor device comprises a MOSFET, the processes of forming the local heat dissipater(s) and forming the MOSFET can be performed such that the local heat dissipater(s) is/are aligned below source/drain extension(s) within the active region, aligned below source/drain(s) within the active region and/or aligned below a channel within the active region.

Another method of forming an SOI structure, having an SOI device with one or more local heat dissipaters, begins with an SOI wafer. This SOI wafer can comprise a semiconductor substrate; an insulator layer on the semiconductor substrate; and, a semiconductor layer on the insulator layer.

One or more local heat dissipaters can then be formed on the SOI wafer. Specifically, for each local heat dissipater, an opening can be formed that extends through the semiconductor layer and the insulator layer to the semiconductor substrate below. Then, a fill material can be deposited in the opening such that it is immediately adjacent to the semiconductor substrate. The fill material can be selected for its thermally conductive and electrically isolative properties. Specifically, the fill material can be more thermally conductive than the insulator layer and less electrically conductive than the semiconductor substrate and semiconductor layer. After the fill material is deposited, it can be etched back to at least level with the top surface of the insulator layer, thereby creating the local heat dissipater.

Then, additional semiconductor material can be deposited within the opening above the fill material to reconstruct the semiconductor layer and additional processing can be performed in order to form a semiconductor device (e.g., an active region of a metal oxide semiconductor field effect transistor (MOSFET), a junction field effect transistor (JFET), a bipolar junction transistor (BJT), a heterojunction bipolar transistor (HBT), a diode, or another semiconductor device) having an active region within the semiconductor layer.

The processes of performing the local heat dissipater(s) and, then, subsequently forming the semiconductor device can be performed such that, within the resulting SOI structure, the local heat dissipater(s) will be aligned below the active region of the semiconductor device and, particularly, aligned below specific component(s) within the active region of the semiconductor device.

For example, in the case where the semiconductor device comprises a MOSFET, the local heat dissipater(s) can be formed and, then, after the local heat dissipater(s) are formed, additional processing can be performed to form the MOSFET such that the local heat dissipater(s) is/are aligned below source/drain extension(s) within the active region, aligned below source/drain(s) within the active region, or aligned below a channel within the active region.

Yet another method of forming an SOI structure, having an SOI device with one or more local heat dissipaters, also begins with an SOI wafer. Specifically, the SOI wafer can comprise a semiconductor substrate; an insulator layer on the semiconductor substrate; and, a semiconductor layer on the insulator layer.

Conventional processing can then be performed in order to form a semiconductor device (e.g., an active region of a metal oxide semiconductor field effect transistor (MOSFET), a junction field effect transistor (JFET), a bipolar junction transistor (BJT), a heterojunction bipolar transistor (HBT), a diode, or another semiconductor device) having an active region within the semiconductor layer.

After the semiconductor device is formed, one or more local heat dissipaters can be formed on the SOI wafer. Specifically, for each local heat dissipater, an opening can be formed that extends through the semiconductor layer and the insulator layer to the semiconductor substrate below. Then, a fill material can be deposited in the opening such that it is immediately adjacent to the semiconductor substrate. The fill material can be selected for its thermally conductive and electrically isolative properties. Specifically, the fill material can be more thermally conductive than the insulator layer and less electrically conductive than the semiconductor substrate and semiconductor layer. After the fill material is deposited, it can be etched back to at least level with the top surface of the insulator layer, thereby creating the local heat dissipater.

Then, additional semiconductor material can be deposited within the opening above the fill material and doped, as necessary, to reconstruct the active region of the semiconductor device within the semiconductor layer. The processes of forming the semiconductor device and, then, subsequently forming the local heat dissipater(s) can be performed such that, within the resulting SOI structure, the local heat dissipater(s) will be aligned below the active region of the semiconductor device and, particularly, aligned below specific component(s) within the active region of the semiconductor device.

For example, in the case where the semiconductor device comprises a MOSFET, the MOSFET can be formed. Then, local heat dissipater(s) can be formed so as to be aligned below source/drain(s) within the active region. In this case, the additional semiconductor material, which is subsequently deposited within the opening(s) above the fill material, can be in situ doped or subsequently implanted with source/drain dopants, to reconstruct the source/drains within the semiconductor layer and complete the MOSFET structure.

Yet another method of forming an SOI structure, having an SOI device with one or more local heat dissipaters, can also begin with an SOI wafer. Specifically, the SOI wafer can comprise a semiconductor substrate; an insulator layer on the semiconductor substrate; and, a semiconductor layer on the insulator layer.

A shallow trench isolation (STI) region can be formed in the semiconductor layer. Specifically, this STI region can be formed so that it extends vertically through the semiconductor layer to the insulator layer and so that it defines boundaries, within the semiconductor layer, of the active region of a semiconductor device (e.g., the active region of a metal oxide semiconductor field effect transistor (MOSFET), a junction field effect transistor (JFET), a bipolar junction transistor (BJT), a heterojunction bipolar transistor (HBT), a diode, or another semiconductor device).

After the STI region is formed, one or more local heat dissipaters can be formed. To form the heat dissipater(s), the method can comprise forming, on opposing sides of the active region, openings that extend through the STI region and the insulator layer to the semiconductor substrate. Optionally, an additional etch process can be performed in order to create a cavity within the insulator layer between the two openings and below the active region. Subsequently, a fill material can be deposited in the openings such that the fill material is immediately adjacent to the semiconductor substrate and, if applicable, such that it fills the cavity below the active region. This fill material can be selected for its thermally conductive and electrically isolative properties. Specifically, the fill material can be more thermally conductive than the insulator layer and less electrically conductive than the semiconductor substrate and semiconductor layer.

After the fill material is deposited, it can be etched back to a level at least below the top surface of the STI region (e.g., to a level between the top surface of the STI region and the top surface of the insulator layer). It should be noted that, if a cavity is not formed below the active region of the semiconductor device, deposition and etch back of the fill material will create two discrete local heat dissipaters positioned laterally adjacent and parallel to the active region of the semiconductor device. However, if such a cavity is formed below the active region, deposition and etch back of the fill material will create a single, relatively large, local heat dissipater aligned below the active region.

Following etch back of the fill material, additional isolation material can be deposited within the openings on the fill material in order to reconstruct the STI region.

Next, additional processing can be performed, as necessary, in order to form the semiconductor device having the active region in the semiconductor layer.

For example, in the case where the semiconductor device to be formed comprises a MOSFET, the active region of the semiconductor device, as defined by the STI region, may have center portion for a designated channel positioned laterally between end portions for designated source/drain extensions and source/drains. The openings can be formed through the STI region such that they are positioned laterally adjacent and parallel to the center portion (i.e., the designated channel) of the active region. The fill material can subsequently be deposited in the openings and then etched back to a level between the top surface of the STI region and the top surface of the insulator layer, thereby creating two local heat dissipaters on opposing sides of the channel. After the fill material is etched back, additional isolation material can be deposited within the openings on the fill material to reconstruct the STI region and additional processing can be performed, as necessary, in order to form the MOSFET structure.

In another example, where the semiconductor device to be formed comprises a MOSFET, the active region of the semiconductor device, as defined by the STI region, may similarly have center portion for a designated channel positioned laterally between end portions for designated source/drain extensions and source/drains. The openings can be formed through the STI region such that they are positioned laterally adjacent and parallel to the center portion (i.e., the designated channel). An additional etch process can be performed in order to create a cavity within the insulator layer between the two openings and below the center portion (i.e., below the designated channel) of the active region. The fill material can subsequently be deposited in the openings so as to fill the cavity and can then be etched back to a level between the top surface of the STI region and the top surface of the insulator layer, thereby creating a single, relatively large, local heat dissipater aligned below the center portion (i.e., the designated channel) of the active region. After the fill material is etched back, additional isolation material can be deposited within the openings on the fill material to reconstruct the STI region and additional processing can be performed in order to form the MOSFET structure.

BRIEF DESCRIPTION OF THE DRAWINGS

The embodiments herein will be better understood from the following detailed description with reference to the drawings, which are not necessarily drawn to scale and in which:

FIG. 3 is a table illustrating electrical conductivity and thermal conductivity for various different materials;

DETAILED DESCRIPTION

Figure 1A:
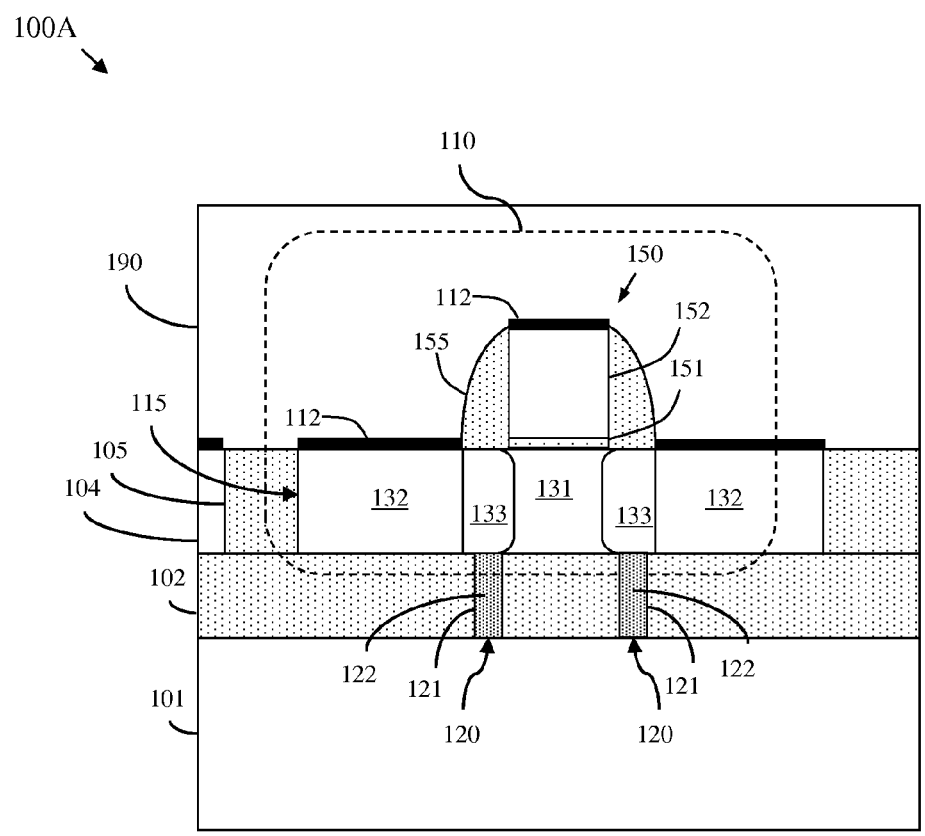
FIG. 1A is a cross-section diagram illustrating a semiconductor-on-insulator (SOI) device with one or more local heat dissipaters.

As mentioned above, typically, with bulk semiconductor devices, heat that is generated internally during device operation (i.e., heat generated due to the self-heating effect) can dissipate quickly through the bulk semiconductor substrate and, thus, has little impact on device performance. However, with semiconductor-on-insulator (SOI) devices, the poor thermal conductivity of the buried insulator layer (e.g., the buried silicon oxide ($SiO_2$) layer) on which the SOI devices sit limits the dissipation of heat generated during device operation. This lack of heat dissipation can cause, for example, a low saturation current, a limited maximum allowable frequency, a reduced lifespan, etc. Furthermore, as the size of SOI devices continues to be scaled, the negative impacts of the lack of heat dissipation can be exacerbated. Various different techniques have been suggested to provide heat dissipation for SOI devices. However, these techniques tend to increase the manufacturing costs and complexity, increase power consumption, and/or result in current leakage.

In view of the foregoing, disclosed herein are semiconductor-on-insulator (SOI) structures comprising an SOI device (e.g., an SOI metal oxide semiconductor field effect transistor (MOSFET) or other SOI device) with one or more local heat dissipaters (also referred to herein as thermal vias (TVs)). Each local heat dissipater can comprise an opening, which is adjacent to an active region of the SOI device, which extends through the insulator layer on which the SOI device sits to the semiconductor substrate below, and which is at least partially filled with a pre-selected fill material. This fill material can be a thermal conductor so as to dissipate heat generated by the SOI device into the semiconductor substrate in order to passively cool the SOI device. The fill material can further be an electrical isolator so as to minimize current leakage from the SOI device to the semiconductor substrate. In the case of a MOSFET, the local heat dissipater(s) can be aligned below the source/drain extension(s) or the source/drain(s) of the MOSFET. Alternatively, the local heat dissipater(s) can be aligned below the channel of the MOSFET or parallel and adjacent to side(s) of the channel of the MOSFET. Also disclosed herein are methods of forming these SOI structures.

More particularly, referring to FIGS. 1A-1F, disclosed herein are semiconductor-on-insulator (SOI) structures 100A-100F. Each SOI structure 100A-100F can comprise a semiconductor substrate 101. The semiconductor substrate 101 can comprise a silicon (Si) substrate or other suitable semiconductor substrate.

Each SOI 100A-100F can comprise an insulator layer 102 on the semiconductor substrate 101. The insulator layer 102 can comprise a buried oxide (BOX) layer (i.e., a silicon oxide ($SiO_x$) layer) or other suitable insulator layer.

Each SOI structure 100A-100F can further comprise a semiconductor layer 104 (e.g., a single crystalline silicon (Si) layer, a single crystalline gallium nitride (GaN) layer or other suitable semiconductor layer) on the insulator layer 102.

Each SOI structure 100A-100F can further comprise, within the semiconductor layer 104, an active region 115 of a semiconductor device 110. For illustration purposes, the semiconductor device 110 is described below and illustrated in FIGS. 1A-1F as being a metal oxide semiconductor field effect transistor (MOSFET). However, it should be understood that this semiconductor device 110 could comprise any other type of semiconductor device including, but not limited to, a junction field effect transistor (JFET), a bipolar junction transistor (BJT), a heterojunction bipolar transistor (HBT), a diode, or any other semiconductor device having self-heating potential.

The active region 115 of the semiconductor device 110 can, for example, be positioned laterally adjacent to a conventional shallow trench isolation (STI) region 105. This STI region 105 can comprise a trench that extends vertically through the semiconductor layer 104 to the insulator layer 102 below and that defines boundaries of the active region 115. This trench can, for example, be filled with one or more isolation materials (e.g., silicon oxide ($SiO_x$), silicon nitride ($SiN_x$), silicon oxynitride ($SiO_xN_y$) or any other suitable isolation material or combination thereof).

Each SOI structure 100A-100F can also further comprise one or more local heat dissipaters 120 (i.e., one or more local thermal vias (TVs)) for dissipating heat from the active region 115 of the semiconductor device 110 and, particularly, from a specific component in the active region 115 of the semiconductor device 110 through the insulator layer 102 to the semiconductor substrate 101 below. That is, each local heat dissipater 120 provides (i.e., is adapted to provide, configured to provide, etc.) a thermally conductive path for heat transfer between the active region 115 of the semiconductor device and, particularly, from a specific component in the active region 115 of the semiconductor device 110 through the insulator layer 102 to the semiconductor substrate 101 below.

Specifically, each local heat dissipater 120 can comprise an opening 121 that extends through the insulator layer 102 to the semiconductor substrate 101 below. As illustrated in the SOI structures 100A-100E of FIGS. 1A-1E, each opening 121 can be aligned below the active region 115 of the semiconductor device 110 and, particularly, aligned below a specific component of the active region 115 of the semiconductor device 110 (see more detailed discussion below of FIGS. 1A-1E). Alternatively, as illustrated in the SOI structure 100F of FIG. 1F, each opening 121 can extend through the STI region 105 as well as the insulator layer 102 and can be positioned laterally adjacent and parallel to the active region 115 of the semiconductor device 110 and, particularly, positioned laterally adjacent and parallel to a specific component of the active region 115 of the semiconductor device 110 (see more detailed discussion below of FIG. 1F).

In any case, the opening(s) 121 for local heat dissipater(s) can essentially vertical sidewalls and, thereby an essentially uniform width, as illustrated in FIGS. 1A-1F. Alternatively, as illustrated in FIGS. 2A and 2B, any of these opening(s) 121 for local heat dissipater(s) 120 can each have a lower portion 211 adjacent to the semiconductor substrate 101 and having a first width 201 and an upper portion 212 above the lower portion 211 and having a second width 202 different from the first width 201. Specifically, the first width 201 can be wider than the second width 202 in order to enhance heat dissipation. For example, as illustrated in FIG. 2A, the opening(s) 121 can be essentially cone-shaped such that the first width 201 is wider than the second width 202. Alternatively, as illustrated in FIG. 2B, the upper portion 212 can comprise essentially vertical sidewalls and the lower portion 211 can comprise curved sidewalls that extend laterally beyond the vertical sidewalls of the upper portion 212 such that the first width 201 is wider than the second width 202.

Each local heat dissipater 120 can further comprise a fill material 122 that at least partially fills the opening 121 such that, within the opening 121, the fill material 122 is immediately adjacent to the semiconductor substrate 101 and also adjacent to the active region 115 of the semiconductor device 110 and, particularly, adjacent to a specific component in the active region 115. The fill material 122 can be selected for its thermally conductive and electrically isolative properties. Specifically, the fill material 122 can be more thermally conductive than the insulator layer 102 so as to allow heat, which is generated in the active region of the SOI device 110, to dissipate from the semiconductor layer 104 through the insulator layer 102 by way of the local heat dissipater 120 and into the semiconductor substrate 101, thereby passively cooling the SOI device 110. Optionally, the fill material 122 can also be more thermally conductive than the semiconductor substrate 101 and the semiconductor layer 104. The fill material 122 can further be electrically insulative (e.g., can have an electrical conductivity that is equivalently comparable to the insulator layer 102) and can, thereby be less electrically conductive than the semiconductor layer 104 and the semiconductor substrate 101 so as to minimize current leakage from the active region 115 of the SOI device 110 to the semiconductor substrate 101.

FIG. 3 is a table illustrating, for various different materials, electrical conductivity, which is measured as the reciprocal of electrical conductivity (i.e., as Ohms·meter $(\Omega \cdot m)^{-1}$), and thermal conductivity, which is measured as watts per meter kelvin (W/m·K). Thus, for example, if the semiconductor substrate 101 and semiconductor layer 104 comprise silicon (Si) and the insulator layer 102 comprises silicon oxide ($SiO_2$), the fill material can comprise any fill material that has relatively high thermal conductivity relative to silicon oxide ($SiO_2$) and that is also electrically isolative (e.g., has an electrical conductivity that is equivalently comparable to silicon oxide ($SiO_2$)). Such materials can include, but are not limited to, aluminum nitride (AlN), aluminum oxide (AlO), beryllium oxide (BeO), and/or sapphire. Each of these materials is more thermally conductive than an insulator layer 102, which comprises silicon oxide ($SiO_2$) and less electrically conductive than a semiconductor substrate 101 and semiconductor layer 104 that each comprise silicon (Si). For example, aluminum nitride (AlN) and beryllium oxide (BeO) both have relatively high thermal conductivity values and relatively low electrical conductivity values as compared to the thermal conductivity values and electrical conductivity values for silicon oxide ($SiO_2$) and silicon (Si). Specifically, aluminum nitride (AlN) has a thermal conductivity of ~285 W/m·K and an electrical conductivity of ~$10^{-14}$ $(\Omega \cdot m)^{-1}$, beryllium oxide (BeO) has a thermal conductivity of ~330 W/m·K and an electrical conductivity of ~$10^{-15}$ $(\Omega \cdot m)^{-1}$, silicon oxide ($SiO_2$) has a thermal conductivity of ~1.38 W/m·K and an electrical conductivity of ~$10^{-18}$ $(\Omega \cdot m)^{-1}$, and silicon (Si) has a thermal conductivity of ~149 W/m·K and an electrical conductivity of ~$10^{-3}$ $(\Omega \cdot m)^{-1}$.

It should be noted that, for greater structural integrity, the fill material 122 can further be selected based on its linear coefficient of thermal expansion and/or its reactivity to semiconductor process chemicals and gases. For example, aluminum nitride (AlN) could be selected as a fill material 122 because it has a linear coefficient of thermal expansion of approximately 5.3, which is relatively close to the linear coefficient of thermal expansion of silicon that is approximately 3, and/or because it is generally non-reactive with normal semiconductor process chemicals and gases.

As mentioned above, the opening(s) 121 for each local heat dissipater 120 can extend through the insulator layer 102 and can be aligned below a specific component of the active region 115 of the semiconductor device 110 (see FIGS. 1A-1E) or, alternatively, can extend through the STI region 105 as well as the insulator layer 102 and can be positioned laterally adjacent and parallel to a specific component of the active region 115 of the semiconductor device 110 (see FIG. 1F below).

For example, in the case where the semiconductor device 110 specifically comprises a MOSFET, as illustrated in each of FIGS. 1A-1F, the active region 115 of the MOSFET can comprise a channel 131 positioned laterally between source/drains 132. The channel 131 can have a first type conductivity and the source/drains 132 can have a second type conductivity. The second type conductivity can be different from the first type conductivity. Optionally, the active region 115 of the MOSFET can further comprise source/drain extension(s) 133 between one or both of the source/drains 132 and the channel 131. The source/drain extension(s) 133 can have the second type conductivity at, for example, a lesser conductivity level than the source/drains 132. Also optionally, the active region 115 of the MOSFET can further comprise halo(s) (not shown) between one or both of the source/drain extension(s) 133 and the channel 131. The halo(s) can have the first conductivity type at, for example, a greater conductivity level than the channel 131. Various different configurations for the source/drains, source/drain extensions, halos and channel region are well known in the art and could be incorporated into this MOSFET. Thus, the details have been omitted from this specification in order to allow the reader to focus on the salient aspects of the disclosed SOI structure.

Those skilled in the art will recognize that the "first type conductivity" and "second type conductivity" will vary depending upon whether MOSFET is an n-type MOSFET (NFET) or p-type MOSFET (PFET). Specifically, for an NFET, the first conductivity type refers to P-type conductivity and the second conductivity type refers to N-type conductivity. However, for a PFET the reverse is true. That is, for a PFET, the first conductivity type refers to N-type conductivity and the second conductivity type refers to P-type conductivity. Those skilled in the art will also recognize that the different dopants can be used to achieve different conductivity types in different semiconductor materials. For example, P-type conductivity can be achieved in silicon or polysilicon through the use of a Group III dopant, such as boron (B) or indium (In), and N-type conductivity can be achieved in silicon or polysilicon through the use of a Group V dopant, such as arsenic (As), phosphorous (P) or antimony (Sb). However, P-type conductivity can be achieved in gallium nitride (GaN) through the use of, for example, magnesium (Mg) and N-type conductivity can be achieved in gallium nitride (GaN) through the use of, for example, silicon (Si). Finally, those skilled in the art will recognize that different conductivity levels can be achieved through the use of different concentrations of such dopants.

The MOSFET 110 can further comprise a gate structure 150 aligned above the channel region 131. The gate structure 150 can comprise a gate stack comprising, for example, one or more gate dielectric layer(s) 151 and one or more gate conductor layer(s) 152 on the gate dielectric layer(s) 151. The MOSFET 110 can further comprise gate sidewall spacer 155 on the opposing sidewalls of the gate structure 150. Various different gate dielectric, gate conductor, and gate sidewall spacer materials as well as various different gate structure configurations are well known in the art and could be incorporated into this MOSFET 110. Thus, the details have been omitted from this specification in order to allow the reader to focus on the salient aspects of the disclosed SOI structure. A silicide layer 112 can, optionally, be positioned on the top surface of the source/drains and gate structure 150 and one or more interlayer dielectrics 190 can cover the MOSFET 110.

In any case, for such a MOSFET 110, the local heat dissipater(s) 120 can be selectively placed to optimize heat dissipation, to minimize current leakage and selectively adjust (i.e., tune) capacitance coupling between the components (e.g., the source/drain extensions 133, the source/drains 132, and/or the channel 131) in the active region 115 of the semiconductor layer 104 and the semiconductor substrate 101.

For example, the opening(s) 121 containing fill material 122 for the local heat dissipater(s) 120 can be selectively placed so that they extend through the insulator layer 102 to the semiconductor substrate 101 below and so that they are aligned below the source/drain extension(s) 133 (e.g., as shown in the SOI structure 100A of FIG. 1A). This configuration is ideal, for example, in a relatively large MOSFET having a gate length between 50 nm and 250 nm (e.g., a gate length of 180 nm), where the heat peak within the active region 115 will be located at the boundary of the channel region 131 and the drain extension.

Figure 2A:
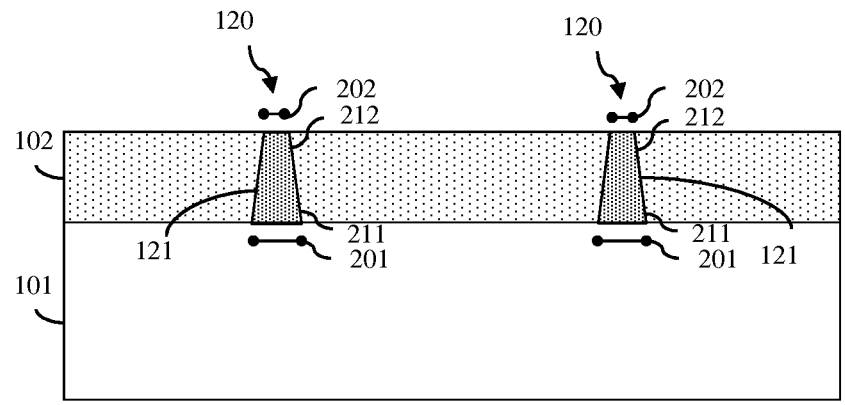
FIG. 2A is a cross-section diagram illustrating alternative shapes for the local heat dissipater(s)
Figure 2B:
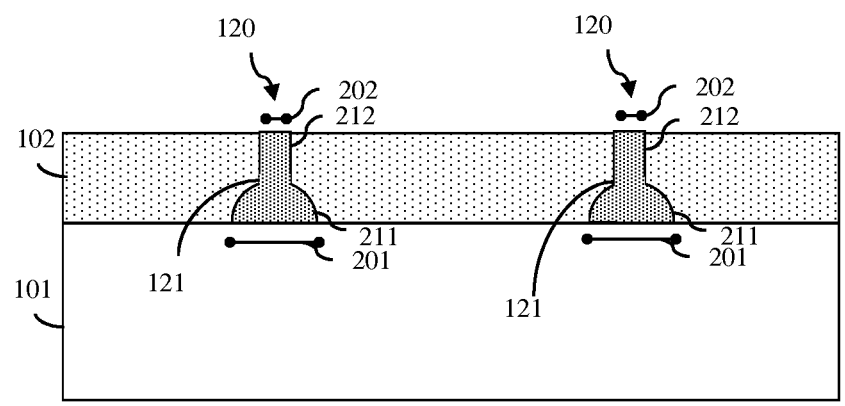
FIG. 2B is a cross-section diagram illustrating other alternative shapes for the local heat dissipater(s)

It should be noted that, in this case, openings 121 for the local heat dissipaters 120 can be aligned below both of the source/drain extensions 133, as illustrated in FIG. 1A, or, alternatively, only below one of the source/drain extensions 133 and, particularly, below the drain extension. Additionally, if openings 121 containing fill material 122 for local heat dissipaters 120 are aligned below both of the source/drain extensions 133, those openings 121 can have the same dimensions (e.g., the same width), as illustrated in FIG. 1A, or, alternatively, they can have different dimensions (e.g., the opening aligned below the source extension can be narrower than the opening 121 aligned below the drain extension).

Alternatively, the opening(s) 121 containing fill material 122 for the local heat dissipater(s) 120 can extend through the insulator layer 102 to the semiconductor substrate 101 below and can be aligned below the source/drains 132 (e.g., as shown in the SOI structures 100B or 100C of FIGS. 1B and 1C, respectively). This configuration is ideal, for example, in a relatively small MOSFET having a gate length between 10 nm and 50 nm (e.g., a gate length of 25 nm), where the heat peak within the active region 115 will be located at the drain.

Figure 1B:
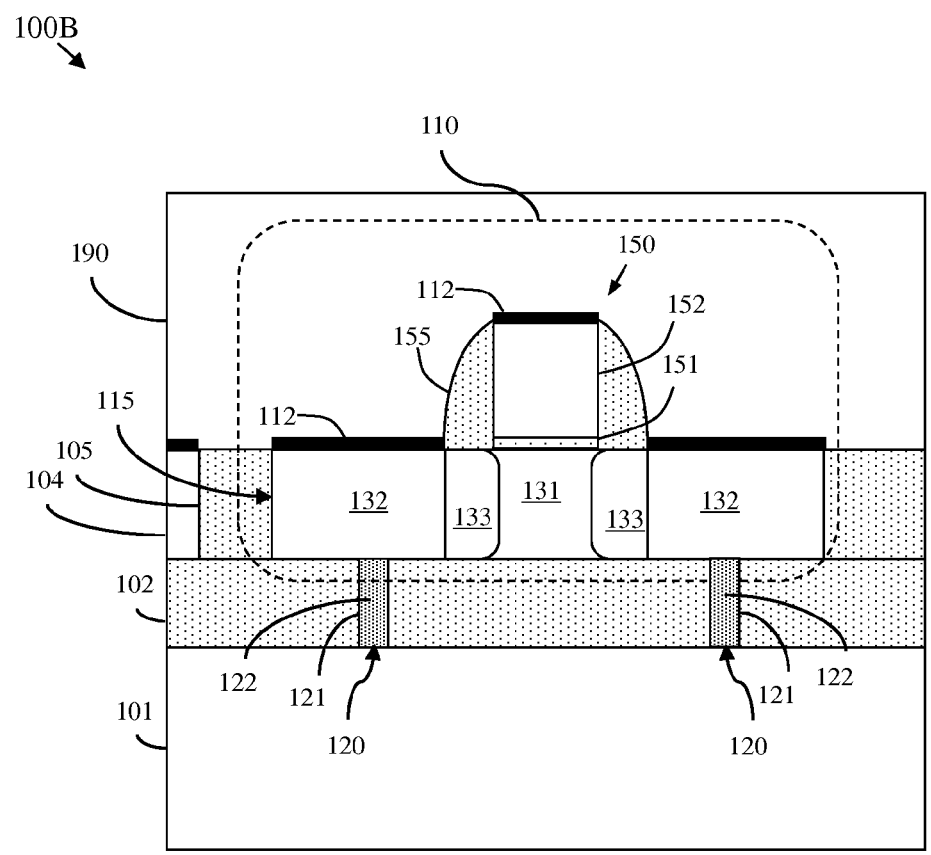
FIG. 1B is a cross-section diagram illustrating another SOI device with one or more local heat dissipaters.
Figure 1C:
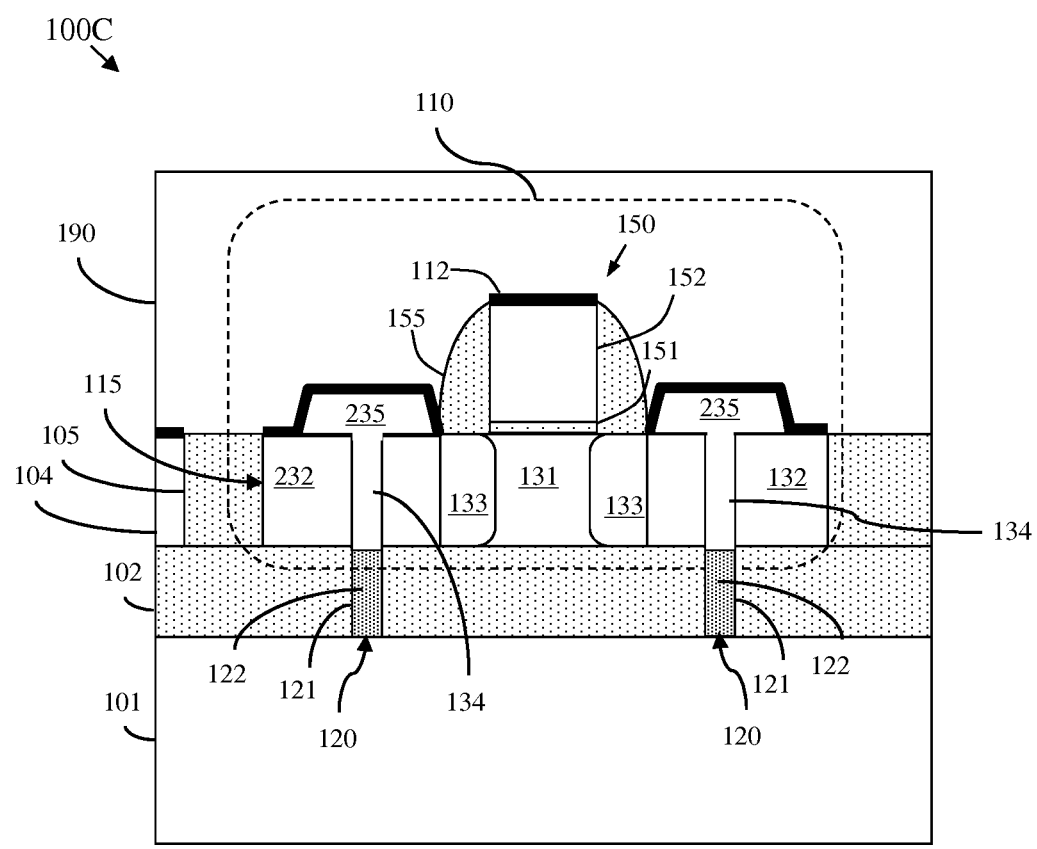
FIG. 1C is a cross-section diagram illustrating yet another SOI device with one or more local heat dissipaters.

It should be noted that, in this case, openings 121 for the local heat dissipaters 120 can be aligned below both of the source/drains 132, as illustrated in FIGS. 1B and 1C, or, alternatively, only below one of the source/drains 132 and, particularly, below the drain. Additionally, if openings 121 containing fill material 122 for local heat dissipaters 120 are aligned below both of the source/drains 132, those openings 121 can have the same dimensions (e.g., the same width), as illustrated in FIGS. 1B and 1C, or, alternatively, they can have different dimensions (e.g., the opening aligned below the source can be narrower than the opening 121 aligned below the drain).

It should also be noted that, as a result of alternative process techniques, which may be used to form the SOI structures 100B and 100C and which are discussed in greater detail below with regard to the methods, the configurations of the source/drains 132 in the SOI structures 100B and 100C may vary. For example, as illustrated in FIG. 1B, one technique involves forming the local heat dissipater(s) 120 within the insulator layer 102 prior to formation of the semiconductor layer 104 on the insulator layer 102. Thus, the source/drains 132 simply comprise doped portions of the active region 115 of the semiconductor device 110. Alternatively, as illustrated in FIG. 1C, another technique involves forming the local heat dissipater(s) 120 following formation of the semiconductor layer 104 on the insulator layer 102. Thus, the opening(s) 121 for the local heat dissipater(s) 120 extend through the semiconductor layer 104 as well as the insulator layer 102. In this case, additional semiconductor material 134 can be formed (e.g., epitaxially deposited) above the fill material 122 within the upper section of each opening 121 that extends through the semiconductor layer 104. This additional semiconductor material 134 can, optionally, be grown such that it extends above the level of the top surface of the semiconductor layer 104 and can be either in-situ doped or subsequently implanted to form raised source/drain regions 235.

Alternatively, opening(s) 121 containing fill material 122 for local heat dissipater(s) 120 can extend through the insulator layer 102 to the semiconductor substrate 101 below and can be aligned below the channel 131 (e.g., as shown in the SOI structures 100D or 100E of FIGS. 1D and 1E, respectively). Optionally, in both of these SOI structures 100D and 100E, a dielectric cap layer 103 (e.g., another silicon oxide layer) can be positioned between the insulator layer 102 and the semiconductor layer 104 and can physically separate the channel 131 from the local heat dissipater(s) 120. As illustrated in the SOI structure 100D of FIG. 1D, a single relatively large opening 121 containing fill material 122 for a single relatively large local heat dissipater 120 can be aligned below the channel 131. Alternatively, as shown in the SOI structure 100E of FIG. 1E, multiple rows of openings 121 (e.g., two or more rows of openings 121) containing fill material 122 for multiple local heat dissipaters 120 can be aligned below the channel 131. In these SOI structures 100D and 100E, the size (e.g., width and height) and shape (e.g., rectangle, cone, etc., as discussed above) and number of the local heat dissipater(s) 120 as well as the thickness of the optional dielectric cap layer 103 can be selectively adjusted in order to selectively adjust (i.e., selectively tune) any capacitance coupling between the channel 131 and the semiconductor substrate 101 below.

Alternatively, opening(s) 121 containing fill material 122 for local heat dissipater(s) 120 can extend through the STI region 105 and the insulator layer 102 to the semiconductor substrate 101 below and can be positioned laterally adjacent and parallel to opposing sides of active region 115 at the channel 131 (i.e., adjacent to the interfaces between the channel 131 within in the active region 115 and STI 105). Optionally, in this case, additional isolation material 123 (e.g., additional silicon oxide (SiO$_2$) material) can be formed above the fill material 122 within the upper section of each opening 121 immediately adjacent to the top surface of the STI region 105. In this SOI structure 100F, the size (e.g., width and height) and shape (e.g., rectangle, cone, etc., as discussed above) of the local heat dissipater(s) 120 can be selectively adjusted in order to selectively adjust (i.e., selectively tune) any capacitance coupling between the channel 131 and the semiconductor substrate 101 below.

Thus, with each of the SOI structures 100A-100F described above, the configuration of the local heat dissipater(s) 120 including, but not limited to, the type of fill material 122, the dimensions (i.e., size, shape, etc.) of the opening(s) 121 containing the fill material 122 and the locations of the opening(s) 121 containing the fill material relative to the locations of specific components (e.g., source/drain extensions 133, source/drains 132, and channel 131) in the active region 115 of the semiconductor device 110 can be predetermined in order to maximize dissipation of heat generated by the semiconductor device 110, to minimize current leakage between the semiconductor device 110 and the semiconductor substrate 101 and to selectively adjust (i.e., tune) capacitance coupling between the components (e.g., the source/drain extensions 133, the source/drains 132, and/or the channel 131) in the active region 115 of the semiconductor device 110 and the semiconductor substrate 101.

Also disclosed herein are various methods of forming the semiconductor-on-insulator (SOI) structures having an SOI device with one or more local heat dissipaters, as discussed in detail above and illustrated in FIGS. 1A-1F.

Figure 4:
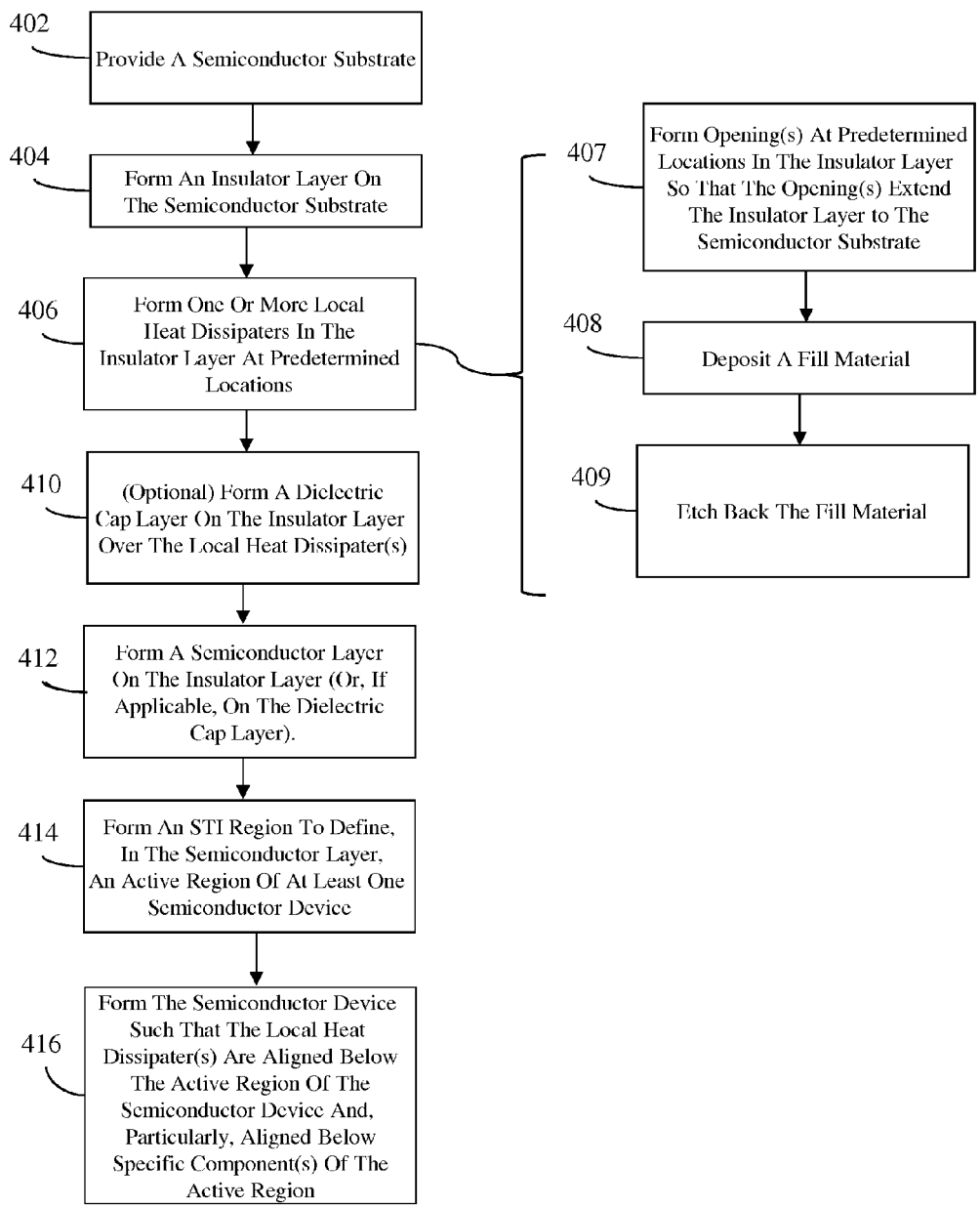
FIG. 4 is a flow diagram illustrating a method of forming an SOI device with one or more local heat dissipaters.

Referring to the flow diagram of FIG. 4, one method of forming an SOI structure, having an SOI device with one or more local heat dissipaters, begins with a semiconductor substrate 101 (402). The semiconductor substrate 101 can comprise, for example, a silicon (Si) substrate or other suitable semiconductor substrate.

Figure 5:
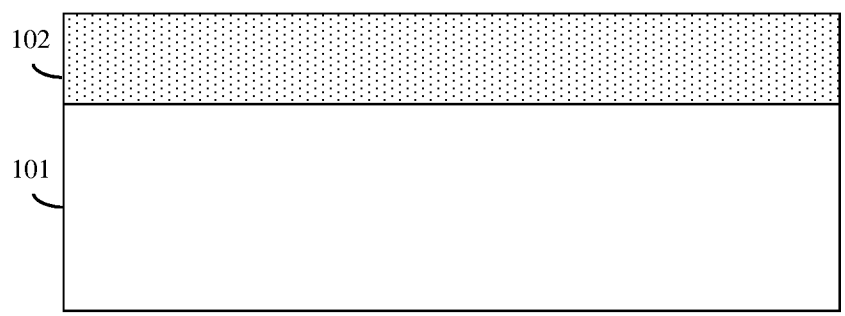
FIG. 5 is a cross-section diagram illustrating a partially completed SOI structure formed according to the method of FIG. 4.

An insulator layer 102 can be formed on the semiconductor substrate 101 (404, see FIG. 5). The insulator layer 102 can comprise, for example, an oxide layer (i.e., a silicon oxide (SiO$_x$) layer) or other suitable insulator layer and can be formed on the semiconductor substrate 101 by, for example, chemical vapor deposition (CVD) or any other suitable deposition process.

Then, at least one local heat dissipater can be formed at a predetermined location in the insulator layer (406). Specifically, for each local heat dissipater 120, an opening 121 can be formed at a predetermined location (see detailed discussion below) on the insulator layer 102 such that the opening 121 extends through the insulator layer 102 to the semiconductor substrate 101 below (407). The location(s) for the opening(s) 121 can be predetermined so that the local heat dissipater(s) will be aligned below the active region and, particularly, specific component(s) in the active region of a semiconductor device subsequently formed above the insulator layer 102 at process 412 (see detailed discussion below). Formation of the opening(s) 121 can be accomplished using, for example, conventional lithographic patterning and etch processes.

Figure 6A:
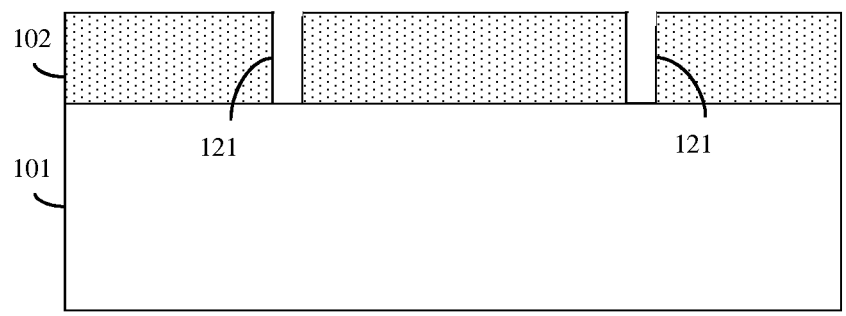
FIG. 6A is a cross-section diagram illustrating a partially completed SOI structure formed according to the method of FIG. 4.
Figure 6B:
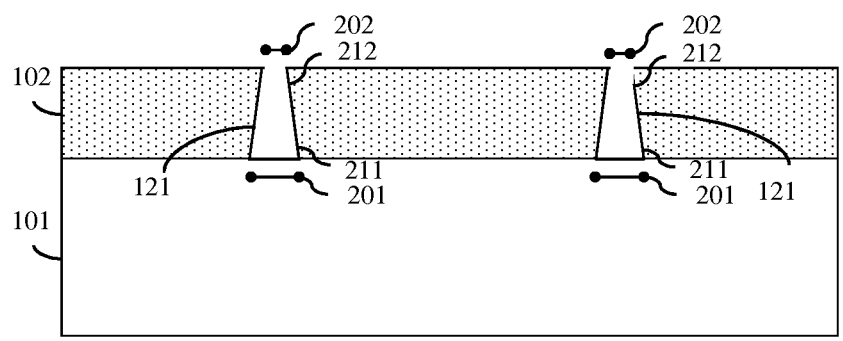
FIG. 6B is a cross-section diagram illustrating a partially completed SOI structure formed according to the method of FIG. 4.
Figure 6C:
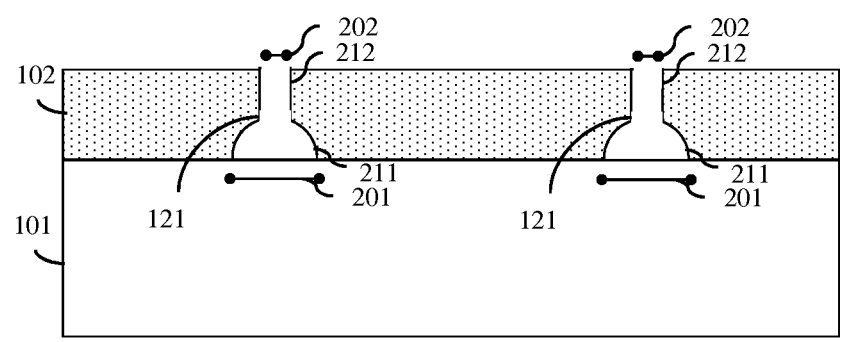
FIG. 6C is a cross-section diagram illustrating a partially completed SOI structure formed according to the method of FIG. 4.

It should be noted that the etch process can comprise an anisotropic (i.e., directional) etch process so that the resulting opening(s) 121 each have essentially vertical sidewalls and, thereby each have an essentially uniform width, as illustrated in FIG. 6A. Alternatively, one or more different etch processes can be performed so that the resulting opening(s) 121 each have a lower portion 211 adjacent to the semiconductor substrate 101 and having a first width 201 and an upper portion 212 above the lower portion 211 and having a second width 202 that is less than the first width 201 (i.e., such that the first width 201 of the lower portion 211 is wider than the second width 202 of the upper portion 212), as illustrated in FIGS. 6B and 6C. Specifically, an etch process can be performed so that the opening(s) 121 are each essentially cone-shaped with the first width 201 of the lower portion 211 being wider than the second width 202 of the upper portion 212, as illustrated in FIG. 6B. Alternatively, multiple etch processes can be such that the opening(s) each have an upper portion 212 with essentially vertical sidewalls and a lower portion 211 with curved sidewalls that extend laterally beyond the vertical sidewalls of the upper portion 212 and, thereby such that the first width 201 of the lower portion 211 is wider than the second width 202 of the upper portion 212, as illustrated in FIG. 6C. For example, an anisotropic (i.e., directional) etch process can be performed followed by an isotropic etch process (e.g., a wet or dry isotropic etch process using a hydrofluoric acid (HF)-based chemistry).

Figure 7:
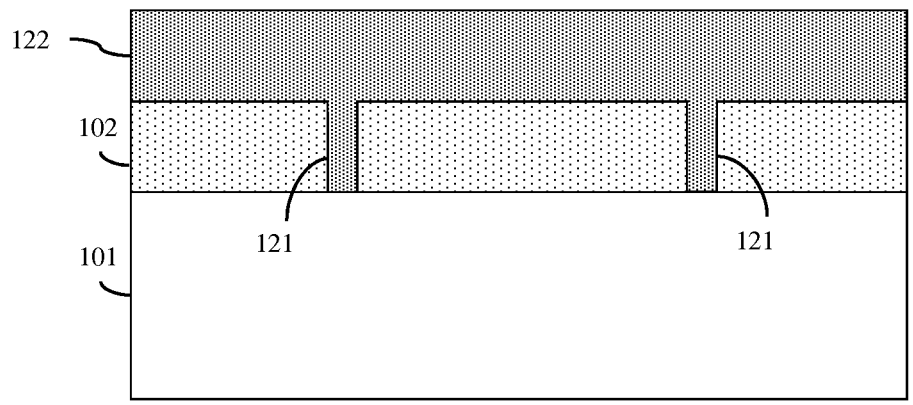
FIG. 7 is a cross-section diagram illustrating a partially completed SOI structure formed according to the method of FIG. 4.

After the opening(s) 121 are formed at process 407, a fill material 122 can be deposited onto the insulator layer 102 and into the opening(s) 121 such that the fill material 122 is immediately adjacent to the semiconductor substrate 101 and fills the openings 121 (408, see FIG. 7). The fill material 122 can be preselected for its thermally conductive and electrically isolative properties. Specifically, the fill material 122 can be preselected such that it is more thermally conductive than the insulator layer 102. The fill material 122 can further be preselected such that it is electrically insulative (e.g., such that it has an electrical conductivity that is equivalently comparable to the insulator layer 102) and, thereby such that it is less electrically conductive than both a semiconductor layer, which will subsequently be formed on the insulator layer 102 at process 412 (see detailed discussion below) and the semiconductor substrate 101. Optionally, the fill material 122 can also be preselected such that it is more thermally conductive than the semiconductor substrate 101 and the semiconductor layer, which will subsequently be formed at process 412.

As discussed in detail above with regard to the SOI structures 100A-F, FIG. 3 is a table illustrating, for various different materials, electrical conductivity, which is measured as the reciprocal of electrical conductivity (i.e., as Ohms·meter $(\Omega \cdot m)^{-1}$), and thermal conductivity, which is measured as watts per meter kelvin (W/m·K). Thus, for example, if the semiconductor substrate 101 and semiconductor layer 104 comprise silicon (Si) and the insulator layer 102 comprises silicon oxide ($SiO_2$), the fill material 122 can comprise any fill material that has relatively high thermal conductivity relative to silicon oxide ($SiO_2$) and that is also electrically isolative (e.g., has an electrical conductivity that is equivalently comparable to silicon oxide ($SiO_2$)). Such materials can include, but are not limited to, aluminum nitride (AlN), aluminum oxide (AlO), beryllium oxide (BeO), and/or sapphire. Each of these materials is more thermally conductive than an insulator layer 102, which comprises silicon oxide ($SiO_2$) and less electrically conductive than a semiconductor substrate 101 and semiconductor layer 104 that each comprise silicon (Si). For example, aluminum nitride (AlN) and beryllium oxide (BeO) both have relatively high thermal conductivity values and relatively low electrical conductivity values as compared to the thermal conductivity values and electrical conductivity values for silicon oxide ($SiO_2$) and silicon (Si). Specifically, aluminum nitride (AlN) has a thermal conductivity of ~285 W/m·K and an electrical conductivity of ~$10^{-14}$ $(\Omega \cdot m)^{-1}$, beryllium oxide (BeO) has a thermal conductivity of ~330 W/m·K and an electrical conductivity of ~$10^{-15}$ $(\Omega \cdot m)^{-1}$, silicon oxide ($SiO_2$) has a thermal conductivity of ~1.38 W/m·K and an electrical conductivity of ~$10^{-18}$ $(\Omega \cdot m)^{-1}$, and silicon (Si) has a thermal conductivity of ~149 W/m·K and an electrical conductivity of ~$10^{-3}$ $(\Omega \cdot m)^{-1}$.

It should be noted that, for greater structural integrity, the fill material 122 can further be selected based on its linear coefficient of thermal expansion and/or its reactivity to semiconductor process chemicals and gases. For example, aluminum nitride (AlN) could be selected as a fill material 122 because it has a linear coefficient of thermal expansion of approximately 5.3, which is relatively close to the linear coefficient of thermal expansion of silicon that is approximately 3, and/or because it is generally non-reactive with normal semiconductor process chemicals and gases.

Figure 8:
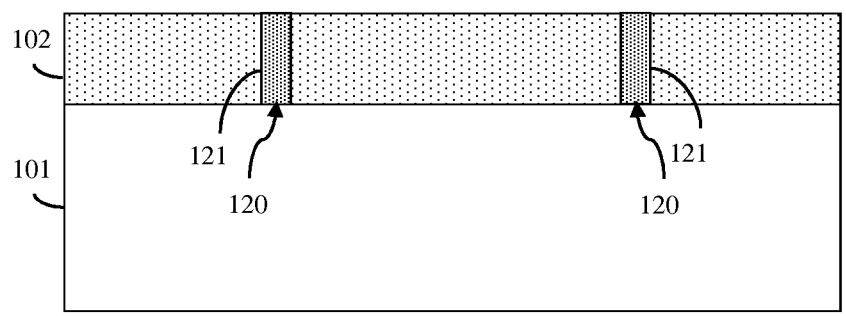
FIG. 8 is a cross-section diagram illustrating a partially completed SOI structure formed according to the method of FIG. 4.
Figure 9:
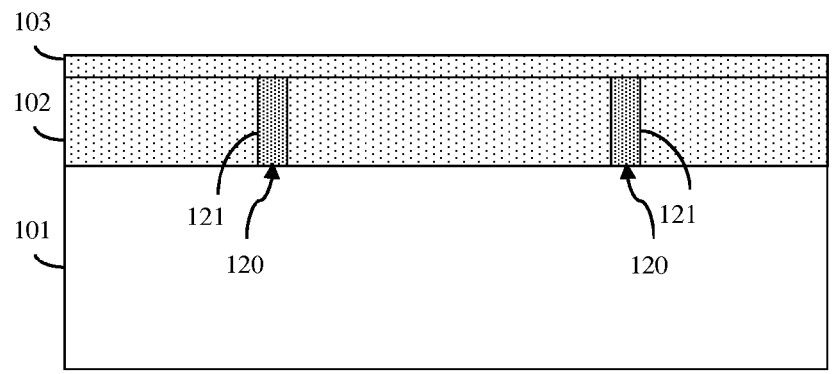
FIG. 9 is a cross-section diagram illustrating a partially completed SOI structure formed according to the method of FIG. 4.

After the fill material 122 is deposited at process 408, it can be etched back to at least the level of the top surface of the insulator layer 102, thereby creating the local heat dissipater(s) 120 within the insulator layer 102 (409, see FIG. 8). Optionally, a dielectric cap layer 103 (e.g., another silicon oxide layer) can be formed (e.g., deposited by chemical vapor deposition (CVD)) on the insulator layer 102 over the local heat dissipater(s) 120 (410, see FIG. 9).

Figure 10:
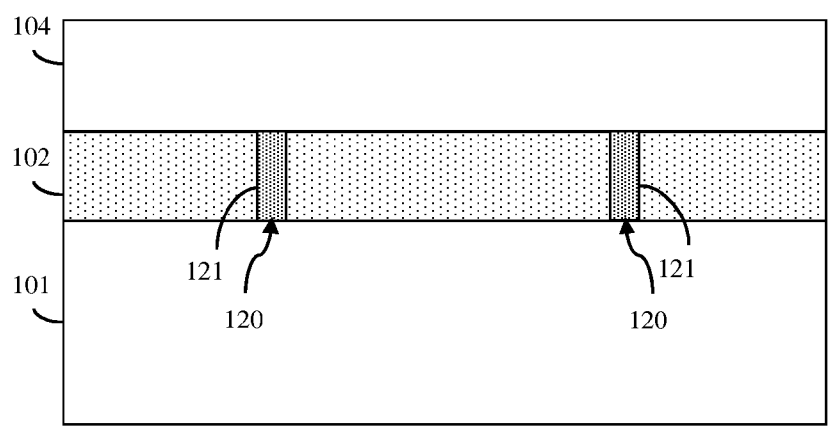
FIG. 10 is a cross-section diagram illustrating a partially completed SOI structure formed according to the method of FIG. 4.

Next, a semiconductor layer 104 can be formed on the insulator layer 102 (412, see FIG. 10). The semiconductor layer 104 can comprise, for example, a single crystalline silicon (Si) layer, a single crystalline gallium nitride (GaN) layer or other suitable single crystalline semiconductor layer. Formation of the semiconductor layer 104 on the insulator layer 102 can be achieved at process 412, for example, using conventional wafer bonding or semiconductor layer transfer techniques. Alternatively, the semiconductor layer 104 can be formed on the insulator layer using any other technique suitable for forming a single crystalline semiconductor layer on an insulator layer.

Figure 11:
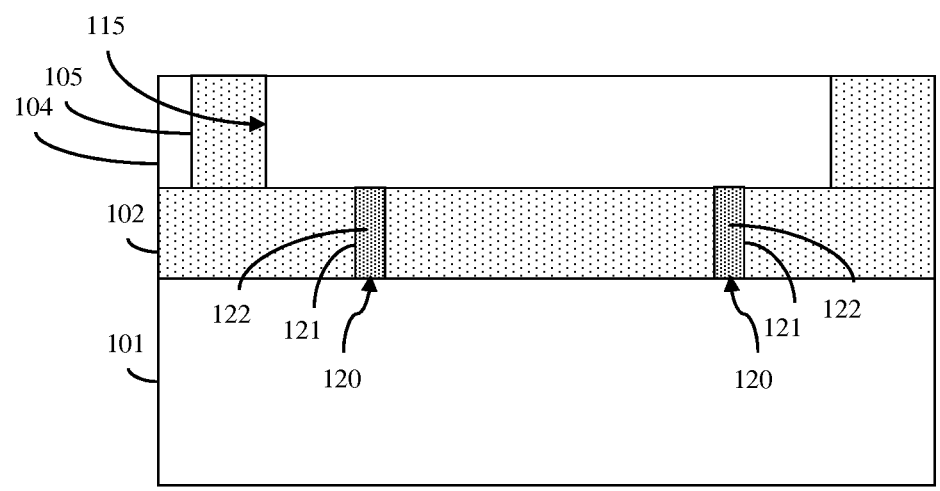
FIG. 11 is a cross-section diagram illustrating a partially completed SOI structure formed according to the method of FIG. 4.

After the semiconductor layer 104 is formed at process 412, a shallow trench isolation (STI) region 105 can be formed in the semiconductor layer 104 in order to define an active region 115 of one or more semiconductor devices (414, see FIG. 11). This STI region 105 can be formed using conventional STI formation techniques. For example, a trench can be lithographically patterned and etched such that it extends vertically through the semiconductor layer 104 to the insulator layer 102 below and such that it defines boundaries of the active region 115. This trench can then be filled, for example, with one or more isolation materials (e.g., silicon oxide ($SiO_x$), silicon nitride ($SiN_x$), silicon oxynitride ($SiO_xN_y$) or any other suitable isolation material or combination thereof).

Following STI region 105 formation at process 414, additional processing can be performed in order to form a semiconductor device with its active region 115 within the semiconductor layer 104 (416). The semiconductor device 110 formed at process 416 can comprise, for example, a metal oxide semiconductor field effect transistor (MOSFET), as illustrated in FIGS. 1A, 1B, 1D and 1E. To form such a MOSFET, a gate structure 150 can be formed on the top surface of the semiconductor layer 104 adjacent to a channel 131 within the active region 115, as defined by the STI region 105. Additionally, various dopant implant processes can be performed in order to form, within the active region 115, a channel 131 positioned laterally between source/drains 132. The channel 131 can have a first type conductivity and the source/drains 132 can have a second type conductivity. The second type conductivity can be different from the first type conductivity. Optionally, these dopant implant processes can be performed such that the active region 115 also comprises source/drain extension(s) 133 between one or both of the source/drains 132 and the channel 131. The source/drain extension(s) 133 can have the second type conductivity at, for example, a lesser conductivity level than the source/drains 132. Also optionally, the dopant implant processes can be performed such that the active region 115 further comprise halo(s) (not shown) between one or both of the source/drain extension(s) 133 and the channel 131. The halo(s) can have the first conductivity type at, for example, a greater conductivity level than the channel 131. Various different techniques for forming MOSFETs and the specific components thereof (e.g., source/drains, source/drain extensions, halos, channel, gate, etc.) are well known in the art. Thus, the details of these techniques have been omitted from this specification in order to allow the reader to focus on the salient aspects of the disclosed method. Alternatively, the semiconductor device formed at process 416 can comprise, for example, a junction field effect transistor (JFET), a bipolar junction transistor (BJT), a heterojunction bipolar transistor (HBT), a diode, or another semiconductor device. Various different techniques for forming such semiconductor devices and the specific components thereof are well known in the art. Thus, the details of these techniques have been omitted from this specification in order to allow the reader to focus on the salient aspects of the disclosed method.

In any case, formation of the semiconductor device 110 at process 416 should be performed such that the local heat dissipater(s) 120 are aligned below and adjacent to the active region 115 of the semiconductor device 110 and, particularly, aligned below and adjacent to specific component(s) in the active region 115 of the semiconductor device, as shown FIGS. 1A, 1B, 1D and 1E.

For example, in the case where the semiconductor device 110 comprises a MOSFET, the processes of forming the local heat dissipater(s) 120 at process 406 and, then, subsequently forming a MOSFET at process 416 can be performed such that the local heat dissipater(s) 120 are aligned below source/drain extension(s) 133 within the active region 115 (e.g., see the SOI structure 100A of FIG. 1A). This configuration is ideal, for example, in a relatively large MOSFET having a gate length between 50 nm and 250 nm (e.g., a gate length of 180 nm), where the heat peak within the active region 115 will typically be located at the boundary of the channel region 131 and the drain extension.

It should be noted that, in this case, multiple openings 121 for multiple local heat dissipaters 120 can be formed at predetermined locations at process 407 such that, when the MOSFET is formed at process 416, the local heat dissipaters 120 will be aligned below both of the source/drain extensions 133, as illustrated in FIG. 1A. Alternatively, only a single opening 121 can be formed at a predetermined location at process 407 such that, when the MOSFET is formed at process 416, only a single local heat dissipater 120 is aligned below only a single one of the source/drain extensions 133 and, particularly, aligned below the drain extension only. Additionally, if multiple openings 121 for multiple local heat dissipaters 120 are formed at predetermined locations at process 407 such that, when the MOSFET is formed at process 416, the local heat dissipaters 120 will be aligned below both of the source/drain extensions 133, those openings 121 can be formed so as to have the same dimensions (e.g., the same width), as illustrated in FIG. 1A. However, alternatively, the multiple openings 121 can be formed so as to have different dimensions (e.g., the opening aligned below the source extension can be narrower than the opening 121 aligned below the drain extension) to optimize heat dissipation.

In another case where the semiconductor device 110 comprises a MOSFET, the processes of forming the local heat dissipater(s) 120 at process 406 and, then, forming the MOSFET at process 416 can be performed such that the local heat dissipater(s) 120 are aligned below source/drain(s) 132 within the active region 115 (e.g., see the SOI structure 100B of FIG. 1B). This configuration is ideal, for example, in a relatively small MOSFET having a gate length between 10 nm and 50 nm (e.g., a gate length of 25 nm), where the heat peak within the active region 115 will be located at the drain.

It should be noted that, in this case, multiple openings 121 for multiple local heat dissipaters 120 can be formed at predetermined locations at process 407 such that, when the MOSFET is formed at process 416, the multiple local heat dissipaters 120 are aligned below both of the source/drains 132, as illustrated in FIG. 1B. Alternatively, only a single opening 121 for a single local heat dissipater 120 can be formed at a predetermined location at process 407 such that, when the MOSFET is formed at process 416, only a single local heat dissipater 120 is aligned below only a single one of the source/drains 132 and, particularly, aligned below the drain only. Additionally, if multiple openings 121 for multiple local heat dissipaters 120 are formed at predetermined locations at process 407 such that, when the MOSFET is formed at process 416, the local heat dissipaters 120 will be aligned below both of the source/drains 132, those openings 121 can be formed so as to have the same dimensions (e.g., the same width), as illustrated in FIG. 1B. However, alternatively, they can be formed so as to have different dimensions (e.g., the opening aligned below the source can be narrower than the opening 121 aligned below the drain) in order to optimize heat dissipation.

In yet another case where the semiconductor device 110 comprises a MOSFET, the processes of forming the local heat dissipater(s) 120 at process 406 and, then, forming the MOSFET at process 416, can be performed such that one or more local heat dissipater(s) 120 are aligned below a channel 131 within the active region 115 (e.g., see the SOI structures 100D and 100E of FIGS. 1D and 1E, respectively. For example, a single opening 121 for a single relatively large heat dissipater 120 be formed at process 406 and, then, the MOSFET can be formed at process 416 such that this single local heat dissipater 120 is aligned below the channel 131, as illustrated in the SOI structure 100D of FIG. 1D. Alternatively, multiple rows of adjacent openings 121 for multiple rows of adjacent local heat dissipaters 120 can be formed at process 407 and, then, the MOSFET can be formed at process 416 such that the rows of adjacent local heat dissipaters 120 are aligned below the channel 131, as illustrated in the SOI structure 100E of FIG. 1E. It should be noted in forming the SOI structures 100D and 100E, the size (e.g., width and height) and shape (e.g., rectangle, cone, etc., as discussed above) and number of the local heat dissipater(s) 120 as well as the thickness of the optional dielectric cap layer 103 can be selectively adjusted in order to selectively adjust (i.e., selectively tune) any capacitance coupling between the channel 131 and the semiconductor substrate 101 below.

Figure 12:
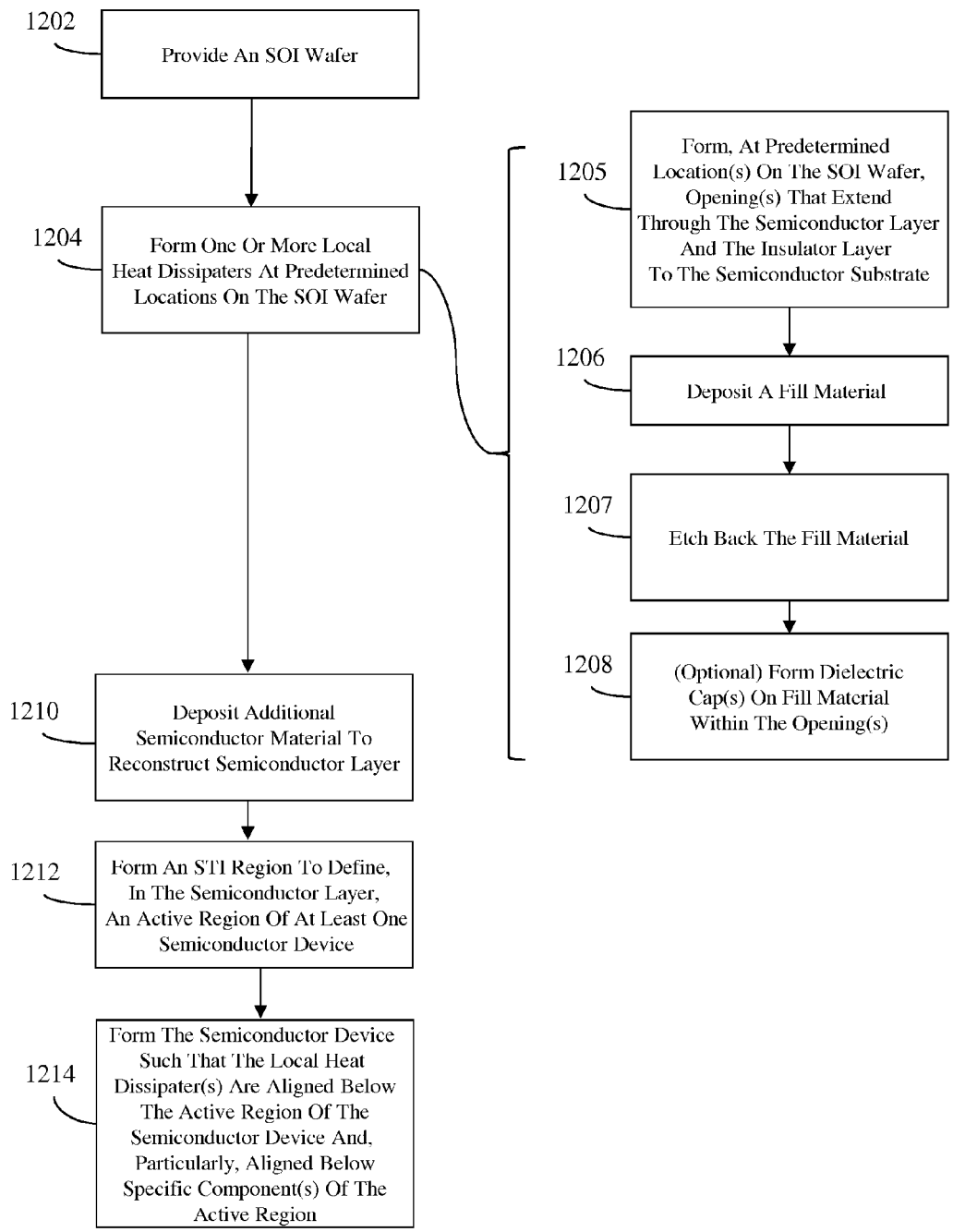
FIG. 12 is a flow diagram illustrating another method of forming an SOI device with one or more local heat dissipaters.
Figure 13:
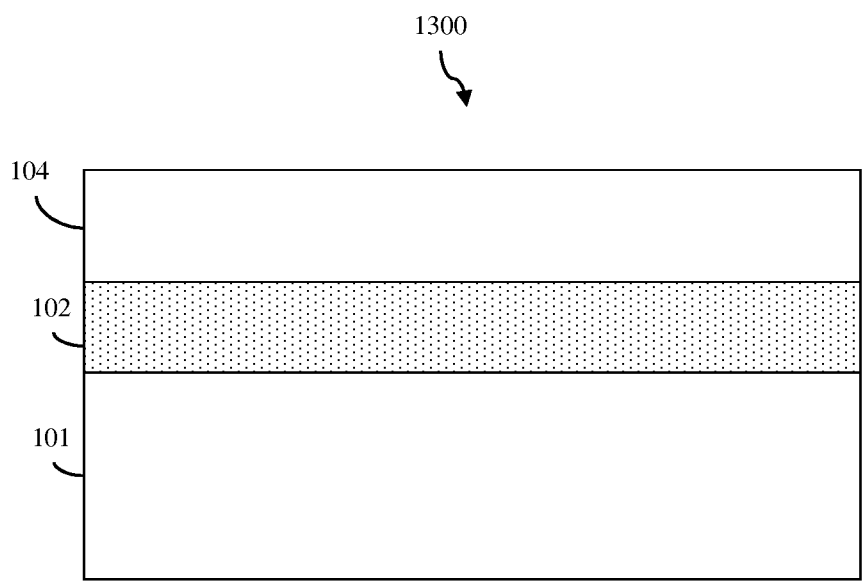
FIG. 13 is a cross-section diagram illustrating a partially completed SOI structure formed according to the method of FIG. 12.

Referring to the flow diagram of FIG. 12, yet another method of forming an SOI structure, having an SOI device with one or more local heat dissipaters, begins with an SOI wafer 1300 (1202, see FIG. 13). Specifically, the SOI wafer can comprise a semiconductor substrate 101; an insulator layer 102 on the semiconductor substrate 101; and, a semiconductor layer 104 on the insulator layer 102. The semiconductor substrate 101 can comprise, for example, a silicon (Si) substrate or other suitable semiconductor substrate. The insulator layer 102 can comprise, for example, a buried oxide (BOX) layer (i.e., a silicon oxide ($SiO_x$) layer) or other suitable insulator layer. The semiconductor layer 104 can comprise a single crystalline silicon (Si) layer, a single crystalline gallium nitride (GaN) layer or other suitable single crystalline semiconductor layer.

Then, one or more local heat dissipaters can be formed on the SOI wafer 1300 at predetermined locations (1204). Specifically, for each local heat dissipater, an opening 121 that extends through the semiconductor layer 104 and the insulator layer 102 to the semiconductor substrate 101 below can be formed at a predetermined location on the SOI wafer 1300 (1205, see FIGS. 14A-14C). The location(s) for the opening(s) 121 can be predetermined so that the local heat dissipater(s) will be aligned below the active region and, particularly, specific component(s) in the active region of a semiconductor device subsequently formed in the semiconductor layer 104 above the insulator layer 102 at process 1214 (see detailed discussion below). Formation of the opening(s) 121 can be accomplished using, for example, conventional lithographic patterning and etch processes.

Figure 14A:
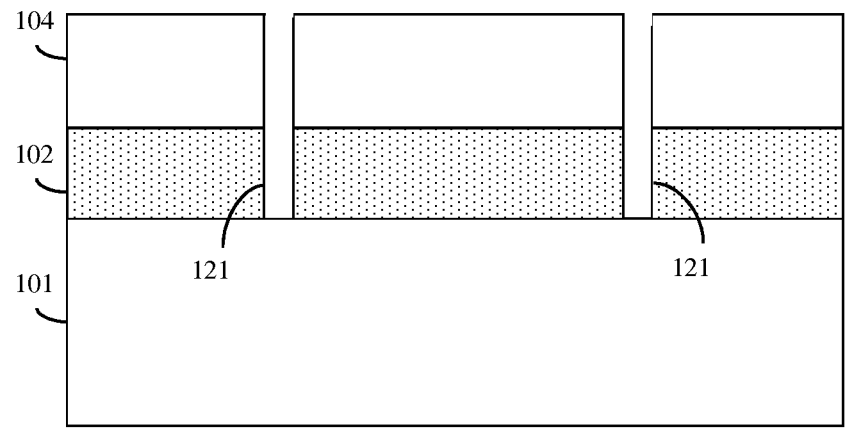
FIG. 14A is a cross-section diagram illustrating a partially completed SOI structure formed according to the method of FIG. 12.
Figure 14B:
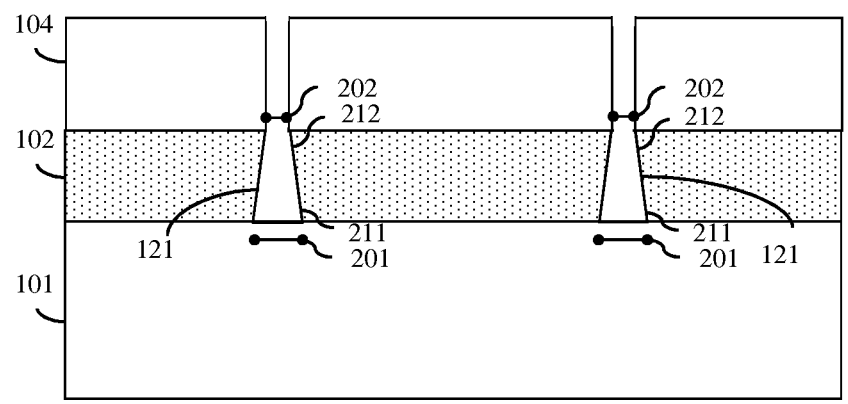
FIG. 14B is a cross-section diagram illustrating a partially completed SOI structure formed according to the method of FIG. 12.
Figure 14C:
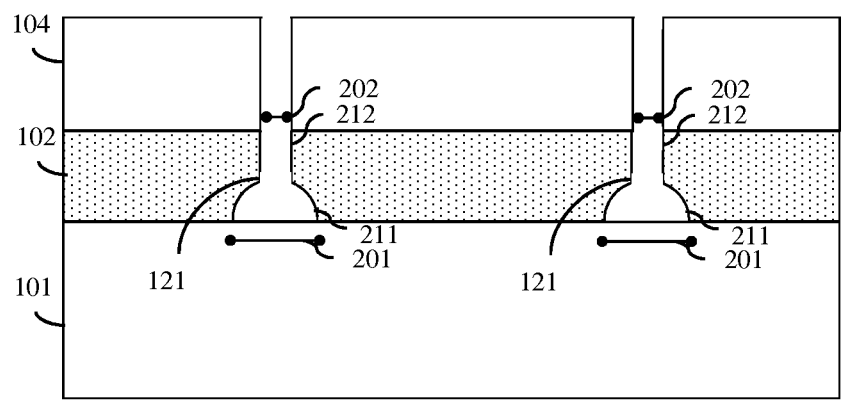
FIG. 14C is a cross-section diagram illustrating a partially completed SOI structure formed according to the method of FIG. 12.

It should be noted that the etch process can comprise an anisotropic (i.e., directional) etch process so that the resulting opening(s) 121 each have essentially vertical sidewalls and, thereby each have an essentially uniform width, as illustrated in FIG. 14A. Alternatively, one or more different etch processes can be performed so that within the insulator layer 102 the resulting opening(s) 121 each have a lower portion 211 adjacent to the semiconductor substrate 101 and having a first width 201 and an upper portion 212 above the lower portion 211 and having a second width 202 that is less than the first width 201 (i.e., such that the first width 201 of the lower portion 211 is wider than the second width 202 of the upper portion 212), as illustrated in FIGS. 14B and 14C. Specifically, an etch process can be performed so that within the insulator layer 102 the opening(s) 121 are each essentially cone-shaped with the first width 201 of the lower portion 211 being wider than the second width 202 of the upper portion 212, as illustrated in FIG. 14B. Alternatively, multiple etch processes can be such that within the insulator layer 102 the opening(s) each have an upper portion 212 with essentially vertical sidewalls and a lower portion 211 with curved sidewalls that extend laterally beyond the vertical sidewalls of the upper portion 212 and, thereby such that the first width 201 of the lower portion 211 is wider than the second width 202 of the upper portion 212, as illustrated in FIG. 14C. For example, an anisotropic (i.e., directional) etch process can be performed followed by an isotropic etch process (e.g., a wet or dry isotropic etch process using a hydrofluoric acid (HF)-based chemistry).

Figure 15:
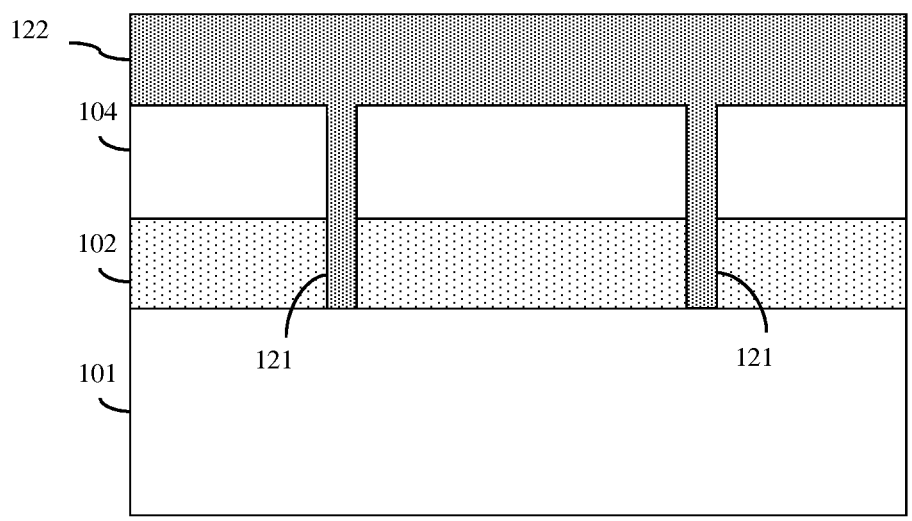
FIG. 15 is a cross-section diagram illustrating a partially completed SOI structure formed according to the method of FIG. 12.

After the opening(s) 121 are formed at process 1205, a fill material 122 can be deposited onto the semiconductor layer 104 and into the opening(s) 121 such that the fill material 122 is immediately adjacent to the semiconductor substrate 101 and fills the openings 121 (1206, see FIG. 15). The fill material 122 can be preselected for its thermally conductive and electrically isolative properties. Specifically, the fill material 122 can be preselected such that it is more thermally conductive than the insulator layer 102. The fill material 122 can further be preselected such that it is also electrically isolative (e.g., has an electrical conductivity that is equivalently comparable to the insulator layer 102) and, thereby such that it is less electrically conductive than both the semiconductor layer 104 and the semiconductor substrate 101. Optionally, the fill material 122 can also be preselected such that it is more thermally conductive than the semiconductor substrate 101 and the semiconductor layer 104. For example, if the semiconductor substrate 101 and semiconductor layer 104 comprise silicon (Si) and the insulator layer 102 comprises silicon oxide ($SiO_2$), the fill material 122 can comprise any of the following: aluminum nitride (AlN), aluminum oxide (AlO), beryllium oxide (BeO), sapphire and/or any other suitable electrically isolative, thermally conductive fill material. See also detailed discussion above regarding the table of FIG. 3.

Figure 16:
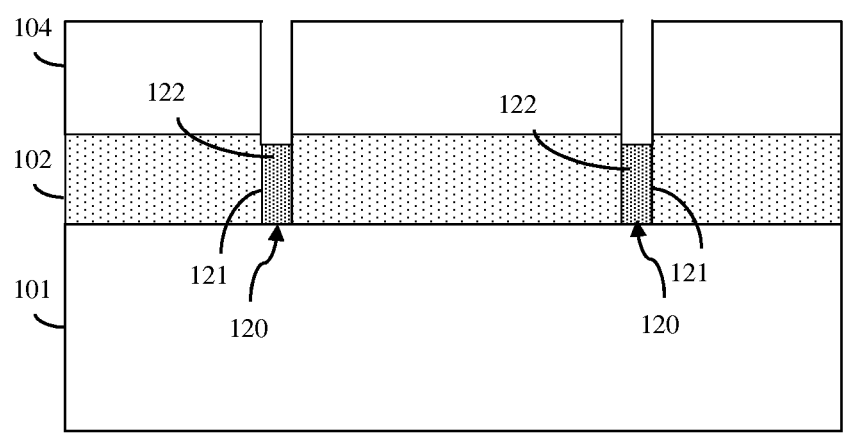
FIG. 16 is a cross-section diagram illustrating a partially completed SOI structure formed according to the method of FIG. 12.

After the fill material 122 is deposited at process 1206, it can be etched back to at least level with the top surface of the insulator layer 102, thereby creating the local heat dissipater(s) 120 (1207, see FIG. 16). Optionally, a dielectric layer can be deposited and etched back to form dielectric caps 135 (e.g., silicon oxide caps) on the fill material 122 within each opening 121 (1208, see FIG. 17). Then, additional semiconductor material 134 and, particularly, additional single crystalline semiconductor material can be deposited (e.g., by selective epitaxial deposition) within the opening(s) 121 above the fill material 122 to reconstruct the semiconductor layer 104 (1210, see FIG. 18).

Figure 19:
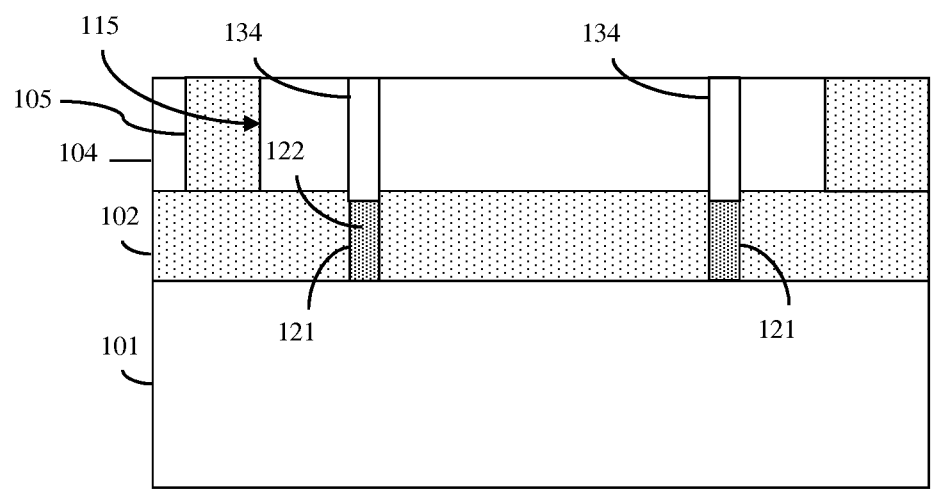
FIG. 19 is a cross-section diagram illustrating a partially completed SOI structure formed according to the method of FIG. 12.

Next, a shallow trench isolation (STI) region 105 can be formed in the semiconductor layer 104 in order to define an active region 115 of one or more semiconductor devices (1212, see FIG. 19). This STI region 105 can be formed using conventional STI formation techniques. For example, a trench can be lithographically patterned and etched such that it extends vertically through the semiconductor layer 104 to the insulator layer 102 below and such that it defines boundaries of the active region 115. This trench can then be filled, for example, with one or more isolation materials (e.g., silicon oxide ($SiO_x$), silicon nitride ($SiN_x$), silicon oxynitride ($SiO_xN_y$) or any other suitable isolation material or combination thereof).

Following STI region 105 formation at process 1212, additional processing can be performed in order to form a semiconductor device 110 with its active region 115 within the semiconductor layer 104 (1214). The semiconductor device 110 formed at process 1214 can comprise a metal oxide semiconductor field effect transistor (MOSFET), as illustrated in FIGS. 1A, 1B, 1D and 1E. To form such a MOSFET, a gate structure 150 can be formed on the top surface of the semiconductor layer 104 adjacent to a channel 131 within the active region 115, as defined by the STI region 105. Additionally, various dopant implant processes can be performed in order to form, within the active region 115, a channel 131 positioned laterally between source/drains 132. The channel 131 can have a first type conductivity and the source/drains 132 can have a second type conductivity. The second type conductivity can be different from the first type conductivity. Optionally, these dopant implant processes can be performed such that the active region 115 also comprises source/drain extension(s) 133 between one or both of the source/drains 132 and the channel 131. The source/drain extension(s) 133 can have the second type conductivity at, for example, a lesser conductivity level than the source/drains 132. Also optionally, the dopant implant processes can be performed such that the active region 115 further comprise halo(s) (not shown) between one or both of the source/drain extension(s) 133 and the channel 131. The halo(s) can have the first conductivity type at, for example, a greater conductivity level than the channel 131. Various different techniques for forming MOSFETs and the specific components thereof (e.g., source/drains, source/drain extensions, halos, channel, gate, etc.) are well known in the art. Thus, the details of these techniques have been omitted from this specification in order to allow the reader to focus on the salient aspects of the disclosed method. Alternatively, the semiconductor device 110 formed at process 1214 can comprise, for example, a junction field effect transistor (JFET), a bipolar junction transistor (BJT), a heterojunction bipolar transistor (HBT), a diode, or another semiconductor device. Various different techniques for forming such semiconductor devices and the specific components thereof are well known in the art. Thus, the details of these techniques have been omitted from this specification in order to allow the reader to focus on the salient aspects of the disclosed method.

In any case, formation of the semiconductor device 110 at process 1214 should be performed such that the local heat dissipater(s) 120 are aligned below and adjacent to the active region 115 of the semiconductor device 110 and, particularly, aligned below and adjacent to specific component(s) in the active region 115 of the semiconductor device, for example, as shown FIGS. 1A, 1B, 1D and 1E.

For example, in the case where the semiconductor device 110 comprises a MOSFET, the processes of forming the local heat dissipater(s) 120 at process 1204 and, then, subsequently forming a MOSFET at process 1214 can be performed such that the local heat dissipater(s) 120 are aligned below source/drain extension(s) 133 within the active region 115 (e.g., see the SOI structure 100A of FIG. 1A). This configuration is ideal, for example, in a relatively large MOSFET having a gate length between 50 nm and 250 nm (e.g., a gate length of 180 nm), where the heat peak within the active region 115 will typically be located at the boundary of the channel region 131 and the drain extension.

It should be noted that, in this case, multiple openings 121 for multiple local heat dissipaters 120 can be formed at predetermined locations at process 1205 such that, when the MOSFET is formed at process 1214, the local heat dissipaters 120 will be aligned below both of the source/drain extensions 133, as illustrated in FIG. 1A. Alternatively, only a single opening 121 can be formed at a predetermined location at process 1205 such that, when the MOSFET is formed at process 1214, only a single local heat dissipater 120 is aligned below only a single one of the source/drain extensions 133 and, particularly, aligned below the drain extension only. Additionally, if multiple openings 121 for multiple local heat dissipaters 120 are formed at predetermined locations at process 1205 such that, when the MOSFET is formed at process 1214, the local heat dissipaters 120 will be aligned below both of the source/drain extensions 133, those openings 121 can be formed so as to have the same dimensions (e.g., the same width), as illustrated in FIG. 1A. However, alternatively, the multiple openings 121 can be formed so as to have different dimensions (e.g., the opening aligned below the source extension can be narrower than the opening 121 aligned below the drain extension) to optimize heat dissipation.

In another case where the semiconductor device 110 comprises a MOSFET, the processes of forming the local heat dissipater(s) 120 at process 1204 and, then, forming the MOSFET at process 1214 can be performed such that the local heat dissipater(s) 120 are aligned below source/drain(s) 132 within the active region 115 (e.g., see the SOI structure 100B of FIG. 1B). This configuration is ideal, for example, in a relatively small MOSFET having a gate length between 10 nm and 50 nm (e.g., a gate length of 25 nm), where the heat peak within the active region 115 will be located at the drain.

It should be noted that, in this case, multiple openings 121 for multiple local heat dissipaters 120 can be formed at predetermined locations at process 1205 such that, when the MOSFET is formed at process 1214, the multiple local heat dissipaters 120 are aligned below both of the source/drains 132, as illustrated in FIG. 1B. Alternatively, only a single opening 121 for a single local heat dissipater 120 can be formed at a predetermined location at process 1205 such that, when the MOSFET is formed at process 1214, only a single local heat dissipater 120 is aligned below only a single one of the source/drains 132 and, particularly, aligned below the drain only. Additionally, if multiple openings 121 for multiple local heat dissipaters 120 are formed at predetermined locations at process 1205 such that, when the MOSFET is formed at process 1214, the local heat dissipaters 120 will be aligned below both of the source/drains 132, those openings 121 can be formed so as to have the same dimensions (e.g., the same width), as illustrated in FIG. 1B. However, alternatively, they can be formed so as to have different dimensions (e.g., the opening aligned below the source can be narrower than the opening 121 aligned below the drain) in order to optimize heat dissipation.

In yet another case where the semiconductor device 110 comprises a MOSFET, the processes of forming the local heat dissipater(s) 120 at process 1204 and, then, forming the MOSFET at process 1214, can be performed such that one or more local heat dissipater(s) 120 are aligned below a channel 131 within the active region 115 (e.g., see the SOI structures 100D and 100E of FIGS. 1D and 1E, respectively). For example, a single opening 121 for a single relatively large heat dissipater 120 be formed at process 1205 and, then, the MOSFET can be formed at process 1214 such that this single local heat dissipater 120 is aligned below the channel 131, as illustrated in the SOI structure 100D of FIG. 1D. Alternatively, multiple rows of adjacent openings 121 for multiple rows of adjacent local heat dissipaters 120 can be formed at process 1205 and, then, the MOSFET can be formed at process 1214 such that the rows of adjacent local heat dissipaters 120 are aligned below the channel 131, as illustrated in the SOI structure 100E of FIG. 1E.

Figure 1D:
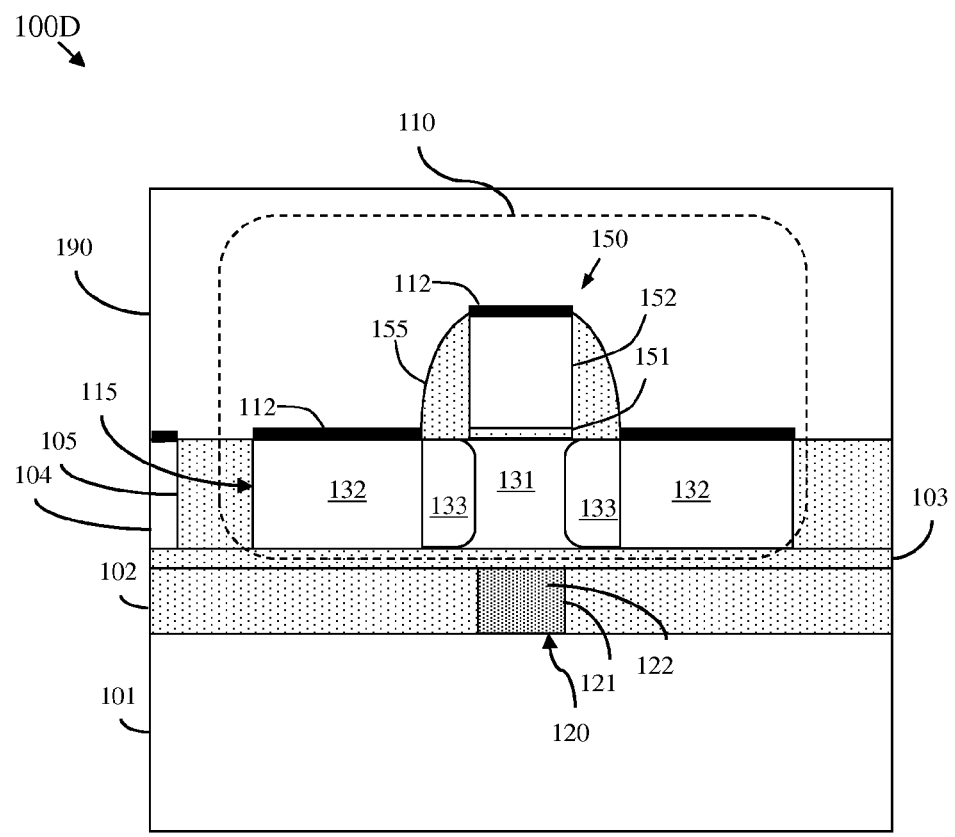
FIG. 1D is a cross-section diagram illustrating yet another SOI device with one or more local heat dissipaters.
Figure 1E:
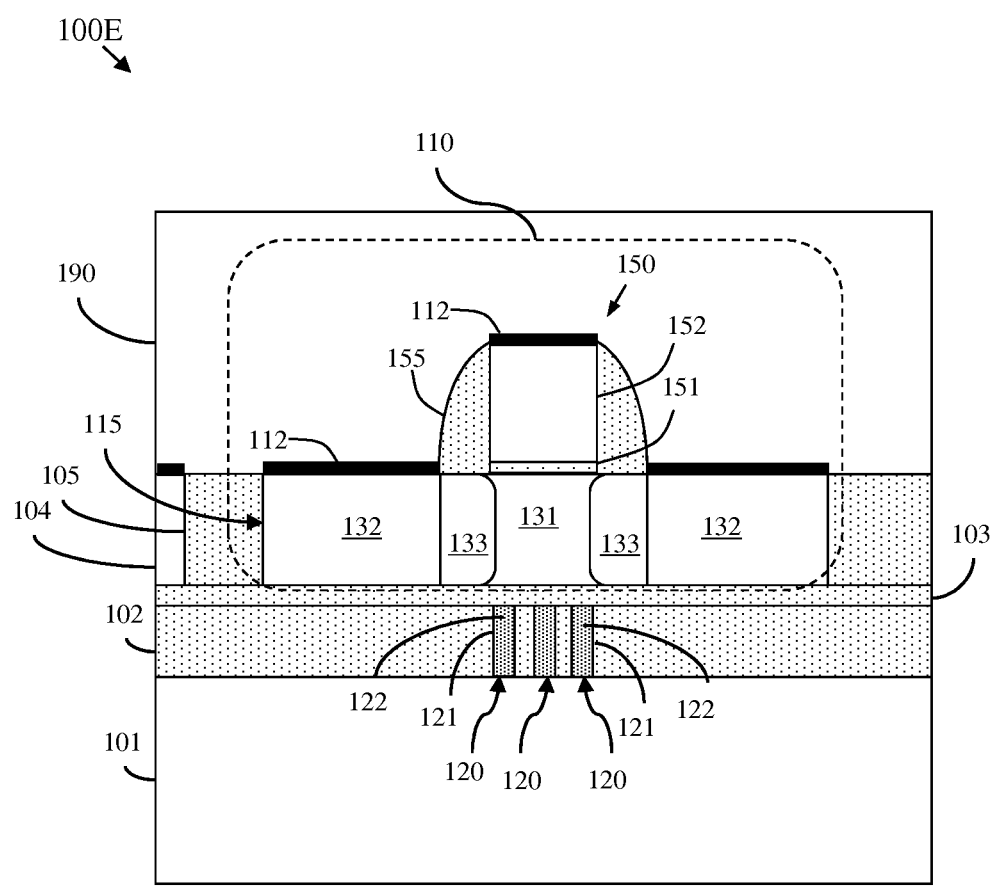
FIG. 1E is a cross-section diagram illustrating yet another SOI device with one or more local heat dissipaters.
Figure 1F:
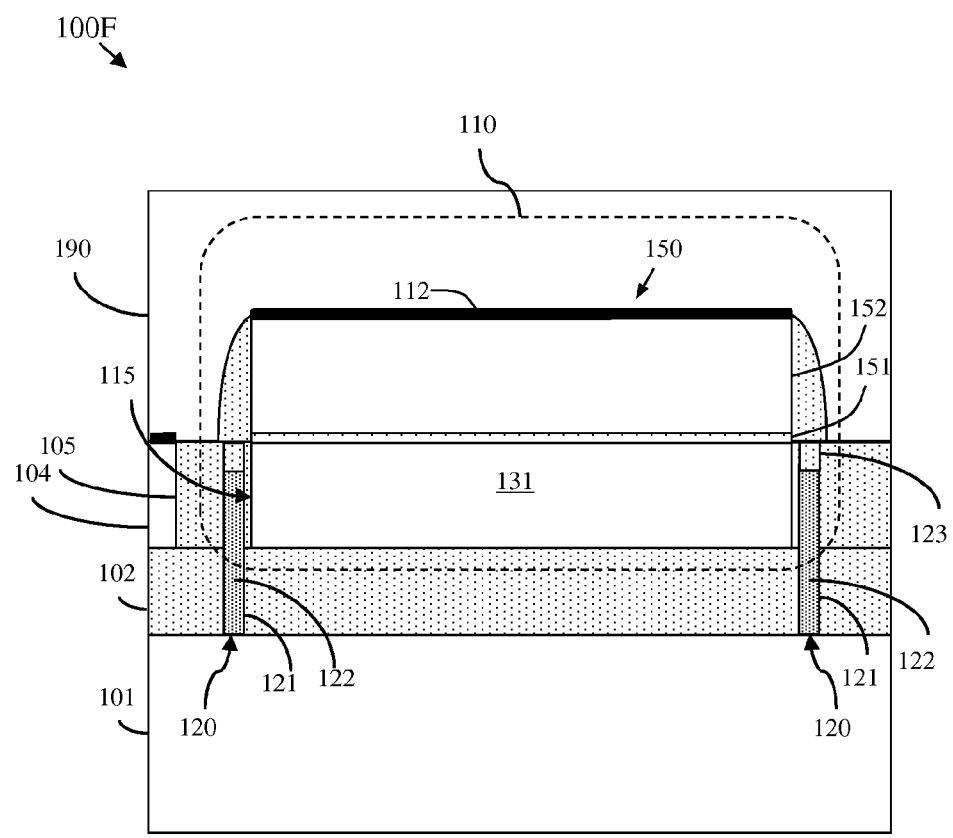
FIG. 1F is a cross-section diagram illustrating yet another SOI device with one or more local heat dissipaters.
Figure 17:
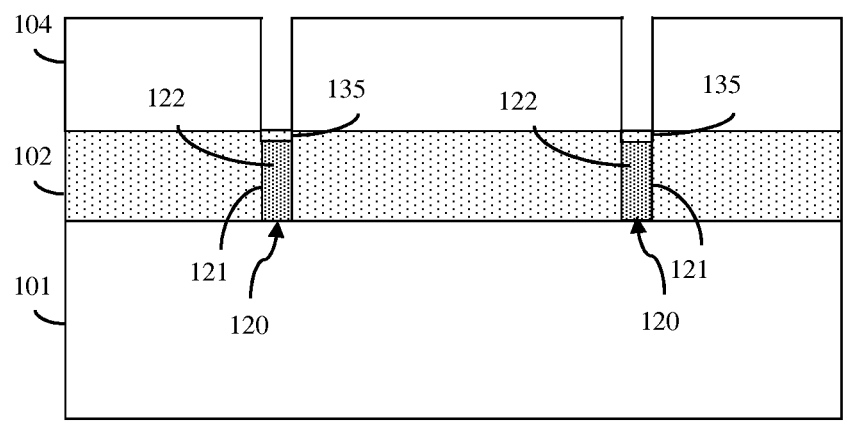
FIG. 17 is a cross-section diagram illustrating a partially completed SOI structure formed according to the method of FIG. 12.
Figure 18:
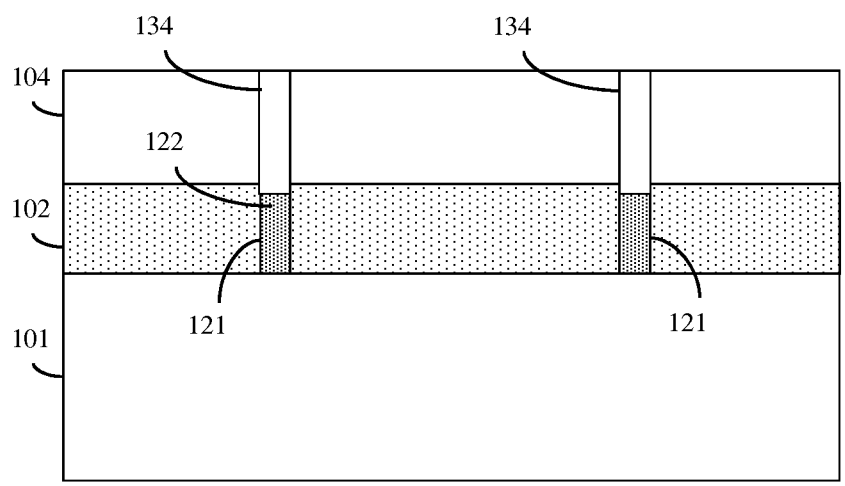
FIG. 18 is a cross-section diagram illustrating a partially completed SOI structure formed according to the method of FIG. 12.

It should be noted that in forming the SOI structures 100D and 100E using this technique optional dielectric caps 135 (as shown in FIG. 17) as opposed to the optional dielectric cap layer 103 (as shown in FIGS. 1D and 1E) could be present in the final SOI structure. In this case, the size (e.g., width and height) and shape (e.g., rectangle, cone, etc., as discussed above) and number of the local heat dissipater(s) 120 as well as the thickness of the optional dielectric caps can be selectively adjusted in order to selectively adjust (i.e., selectively tune) any capacitance coupling between the channel 131 and the semiconductor substrate 101 below.

Figure 20:
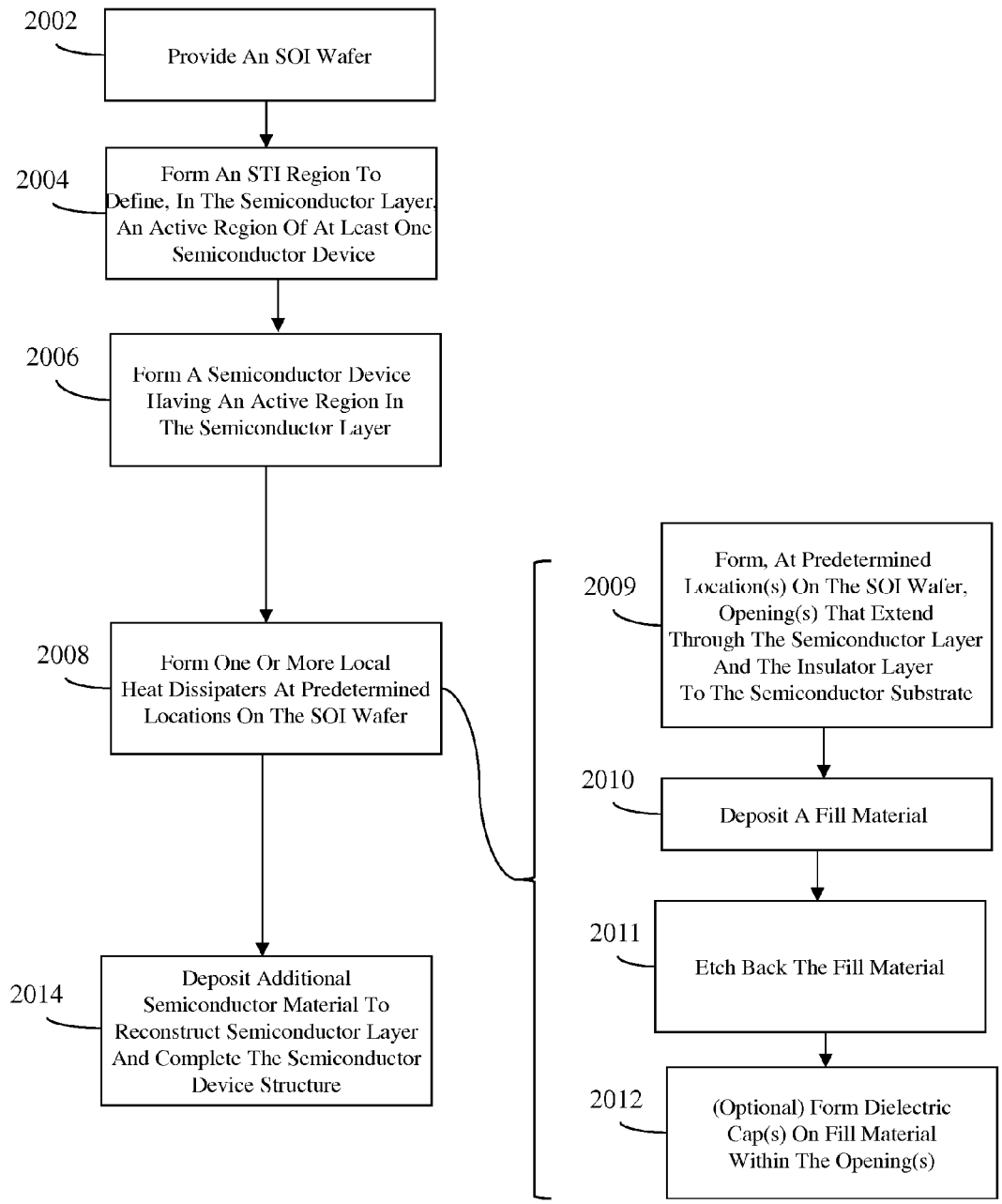
FIG. 20 is a flow diagram illustrating yet another method of forming an SOI device with one or more local heat dissipaters.

Referring to the flow diagram of FIG. 20, yet another method of forming an SOI structure, having an SOI device with one or more local heat dissipaters, begins with an SOI wafer 1300 (2002, see FIG. 13). Specifically, the SOI wafer can comprise a semiconductor substrate 101; an insulator layer 102 on the semiconductor substrate 101; and, a semiconductor layer 104 on the insulator layer 102. The semiconductor substrate 101 can comprise, for example, a silicon (Si) substrate or other suitable semiconductor substrate. The insulator layer 102 can comprise, for example, a buried oxide (BOX) layer (i.e., a silicon oxide ($SiO_x$) layer) or other suitable insulator layer. The semiconductor layer 104 can comprise a single crystalline silicon (Si) layer, a single crystalline gallium nitride (GaN) layer or other suitable single crystalline semiconductor layer.

Figure 21:
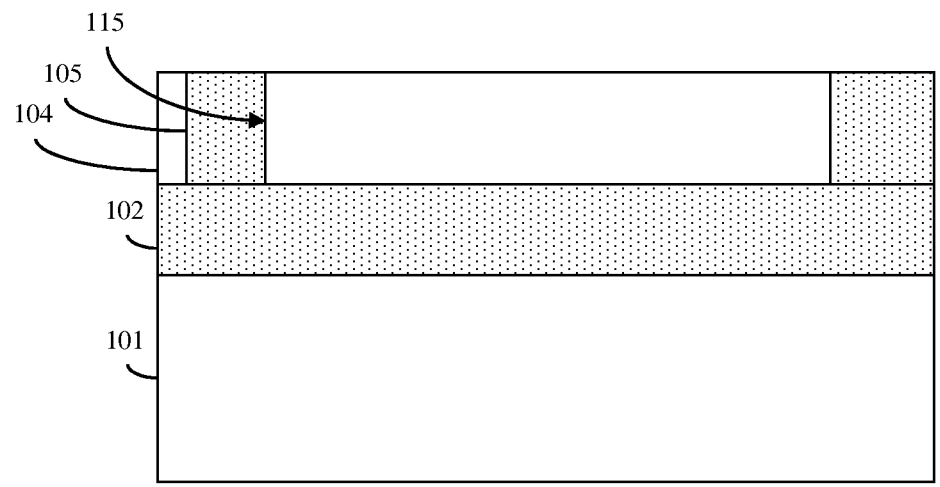
FIG. 21 is a cross-section diagram illustrating a partially completed SOI structure formed according to the method of FIG. 20.

Next, a shallow trench isolation (STI) region 105 can be formed in the semiconductor layer 104 in order to define an active region 115 of one or more semiconductor devices (2004, see FIG. 21). This STI region 105 can be formed using conventional STI formation techniques. For example, a trench can be lithographically patterned and etched such that it extends vertically through the semiconductor layer 104 to the insulator layer 102 below and such that it defines boundaries of the active region 115. This trench can then be filled, for example, with one or more isolation materials (e.g., silicon oxide ($SiO_x$), silicon nitride ($SiN_x$), silicon oxynitride ($SiO_xN_y$) or any other suitable isolation material or combination thereof).

Figure 22:
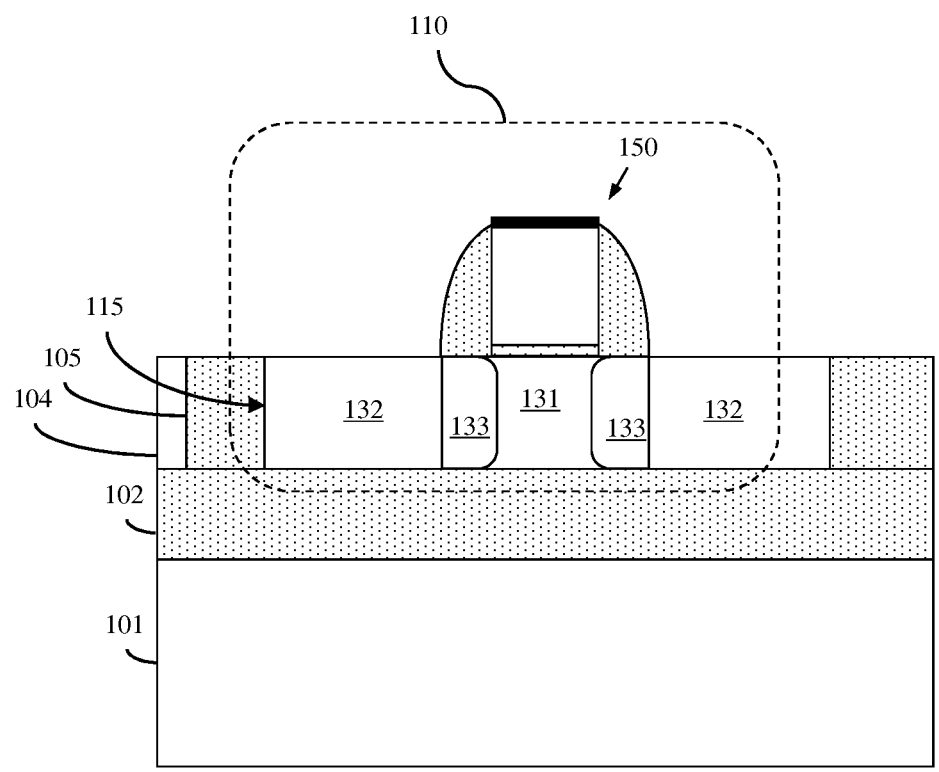
FIG. 22 is a cross-section diagram illustrating a partially completed SOI structure formed according to the method of FIG. 20.

Conventional processing can then be performed in order to form a semiconductor device 110 having an active region 115 within the semiconductor layer 104 (2006, see FIG. 22). The semiconductor device 110 formed at process 2006 can comprise a metal oxide semiconductor field effect transistor (MOSFET), as illustrated in FIG. 22. To form such a MOSFET, a gate structure 150 can be formed on the top surface of the semiconductor layer 104 adjacent to a channel 131 within the active region 115, as defined by the STI region 105. Additionally, various dopant implant processes can be performed in order to form, within the active region 115, a channel 131 positioned laterally between source/drains 132. The channel 131 can have a first type conductivity and the source/drains 132 can have a second type conductivity. The second type conductivity can be different from the first type conductivity. Optionally, these dopant implant processes can be performed such that the active region 115 also comprises source/drain extension(s) 133 between one or both of the source/drains 132 and the channel 131. The source/drain extension(s) 133 can have the second type conductivity at, for example, a lesser conductivity level than the source/drains 132. Also optionally, the dopant implant processes can be performed such that the active region 115 further comprise halo(s) (not shown) between one or both of the source/drain extension(s) 133 and the channel 131. The halo(s) can have the first conductivity type at, for example, a greater conductivity level than the channel 131. Various different techniques for forming MOSFETs and the specific components thereof (e.g., source/drains, source/drain extensions, halos, channel, gate, etc.) are well known in the art. Thus, the details of these techniques have been omitted from this specification in order to allow the reader to focus on the salient aspects of the disclosed method. Alternatively, the semiconductor device formed at process 2006 can comprise, for example, a junction field effect transistor (JFET), a bipolar junction transistor (BJT), a heterojunction bipolar transistor (HBT), a diode, or another semiconductor device. Various different techniques for forming such semiconductor devices and the specific components thereof are well known in the art. Thus, the details of these techniques have been omitted from this specification in order to allow the reader to focus on the salient aspects of the disclosed method.

Figure 23:
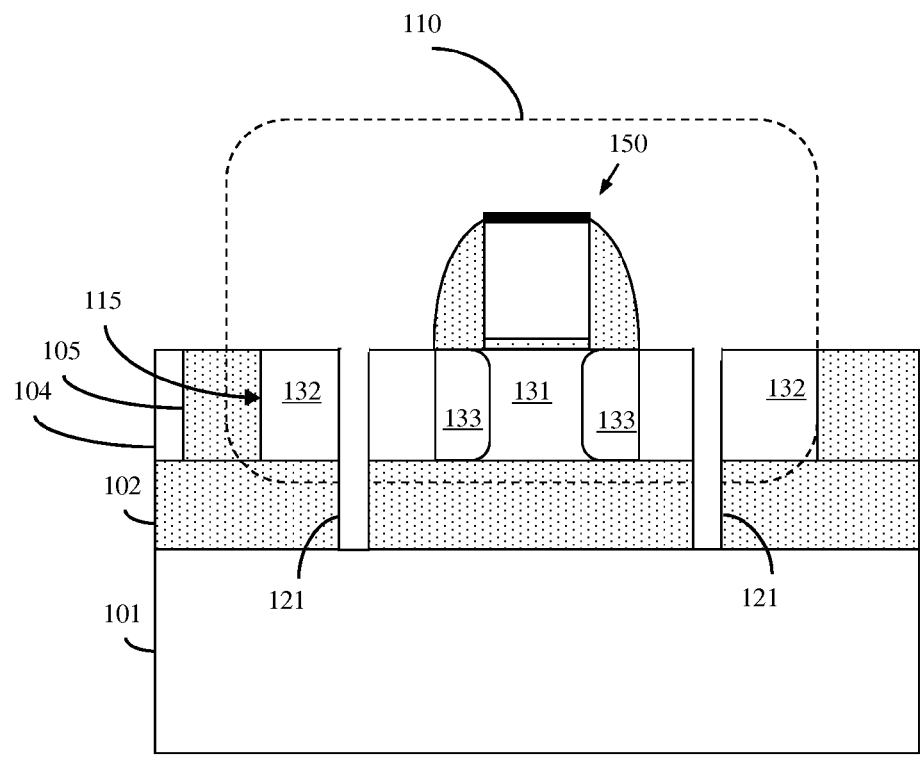
FIG. 23 is a cross-section diagram illustrating a partially completed SOI structure formed according to the method of FIG. 20.

After the semiconductor device 110 is formed at process 2006, one or more local heat dissipaters can be formed at predetermined location(s) on the SOI wafer (2008). Specifically, for each local heat dissipater, an opening 121 that extends through the semiconductor layer 104 and the insulator layer 102 to the semiconductor substrate 101 below can be formed at a predetermined location on the SOI wafer 1300 (2009, see FIG. 23). The location(s) for the opening(s) 121 can be predetermined so that the local heat dissipater(s) will be aligned below the active region and, particularly, specific component(s) in the active region of the semiconductor device 110 previously formed at process 2006. For example, in the case where the semiconductor device 110 comprises a MOSFET, the location(s) for the opening(s) 121 can be predetermined so that the local heat dissipater(s) will be aligned below the source/drain(s) 132, as shown in FIG. 23.

Formation of the opening(s) 121 can be accomplished using, for example, conventional lithographic patterning and etch processes. However, as discussed above with regard to FIGS. 14A-14C, the processes can be tailored so that the resulting opening(s) 121 each have an essentially uniform width or, alternatively, so that, within the insulator layer 102, the resulting opening(s) 121 each have a lower portion 211 adjacent to the semiconductor substrate 101 and having a first width 201 and an upper portion 212 above the lower portion 211 and having a second width 202 that is less than the first width 201.

Figure 24:
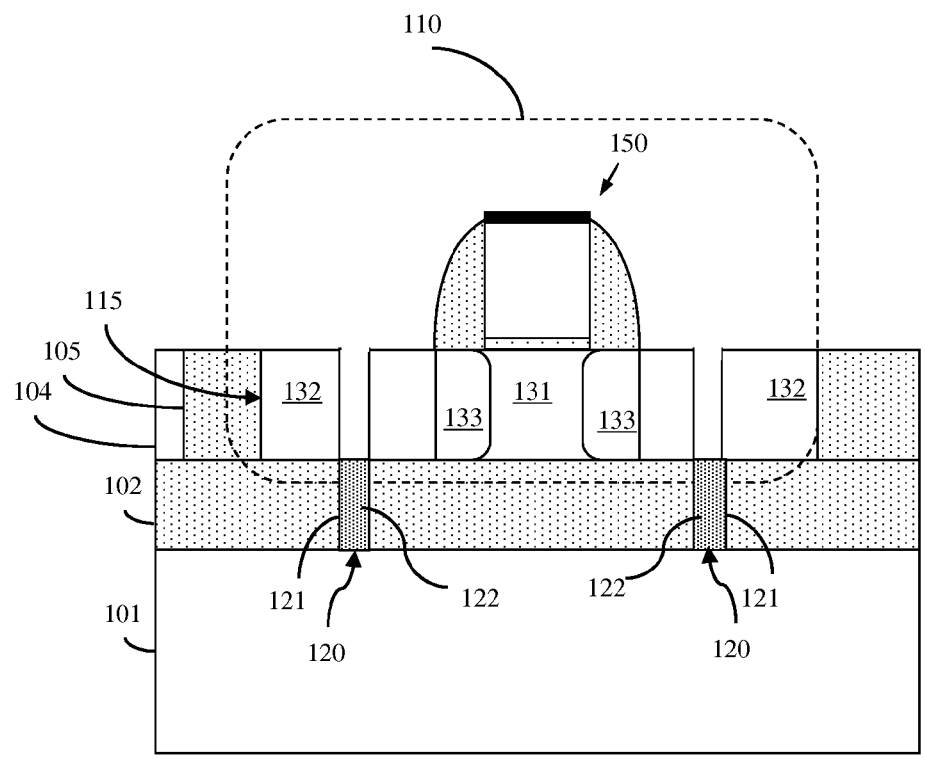
FIG. 24 is a cross-section diagram illustrating a partially completed SOI structure formed according to the method of FIG. 20.

After the opening(s) 121 are formed at process 2009, a fill material 122 can be deposited onto the semiconductor layer 104 and into the opening(s) 121 such that the fill material 122 is immediately adjacent to the semiconductor substrate 101 (2010, see FIG. 24). The fill material 122 can be preselected for its thermally conductive and electrically isolative properties. Specifically, the fill material 122 can be preselected such that it is more thermally conductive than the insulator layer 102. The fill material 122 can further be preselected such that it is electrically insulative (e.g., such that it has an electrical conductivity that is equivalently comparable to the insulator layer 102) and, thereby such that it is less electrically conductive than both the semiconductor layer 104 and the semiconductor substrate 101. Optionally, the fill material 122 can also be preselected such that it is more thermally conductive than the semiconductor substrate 101 and the semiconductor layer 104. For example, if the semiconductor substrate 101 and semiconductor layer 104 comprise silicon (Si) and the insulator layer 102 comprises silicon oxide ($SiO_2$), the fill material 122 comprise any of the following materials: aluminum nitride (AlN), aluminum oxide (AlO), beryllium oxide (BeO), sapphire and/or any other suitable electrically isolative, thermally conductive fill material. See also detailed discussion above regarding the table of FIG. 3.

After the fill material 122 is deposited at process 2010, it can be etched back to at least level with the top surface of the insulator layer 102, thereby creating the local heat dissipater(s) 120 (2011, see FIG. 24). Optionally, a dielectric layer can be deposited and etched back to form dielectric caps (e.g., silicon oxide caps), not shown, on the fill material 122 within each opening 121 (2012). Then, additional semiconductor material 134 and, particularly, additional single crystalline semiconductor material can be deposited (e.g., by selective epitaxial deposition) within the opening(s) 121 above the fill material 122 to reconstruct the semiconductor layer 104 (2014).

For example, in the case where the semiconductor device 110 formed at process 2004 comprises a MOSFET and the opening(s) 121 are formed at process 2009 so that the resulting local heat dissipater(s) 120 will be aligned below source/drain(s) within the active region, the additional semiconductor material 134 can be deposited and, either in situ doped or subsequently implanted with source/drain dopants, to reconstruct the source/drains 132 within the semiconductor layer 104 and complete the MOSFET structure, as shown in FIG. 1C. Furthermore, this additional semiconductor material 134 can, optionally, be grown such that it extends above the level of the top surface of the semiconductor layer 104, thereby forming to raised source/drain regions 235.

Figure 25:
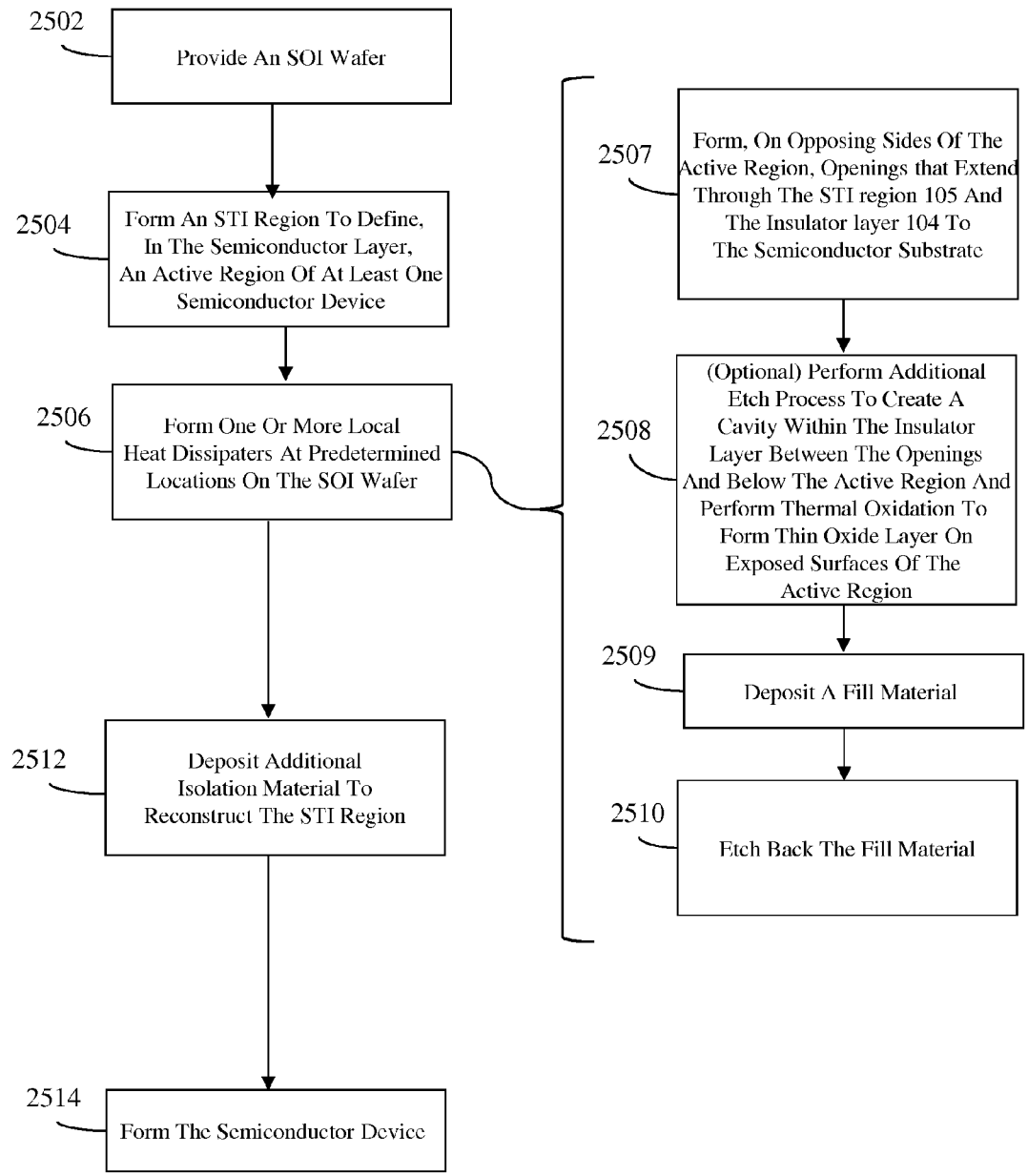
FIG. 25 is a flow diagram illustrating yet another method of forming an SOI device with one or more local heat dissipaters.

Referring to the flow diagram of FIG. 25, yet another method of forming an SOI structure, having an SOI device with one or more local heat dissipaters, begins with an SOI wafer 1300 (2502, see FIG. 13). Specifically, the SOI wafer 1300 can comprise a semiconductor substrate 101; an insulator layer 102 on the semiconductor substrate 101; and, a semiconductor layer 104 on the insulator layer 102. The semiconductor substrate 101 can comprise, for example, a silicon (Si) substrate or other suitable semiconductor substrate. The insulator layer 102 can comprise, for example, a buried oxide (BOX) layer (i.e., a silicon oxide ($SiO_x$) layer) or other suitable insulator layer. The semiconductor layer 104 can comprise a single crystalline silicon (Si) layer, a single crystalline gallium nitride (GaN) layer or other suitable single crystalline semiconductor layer.

Figure 26A:
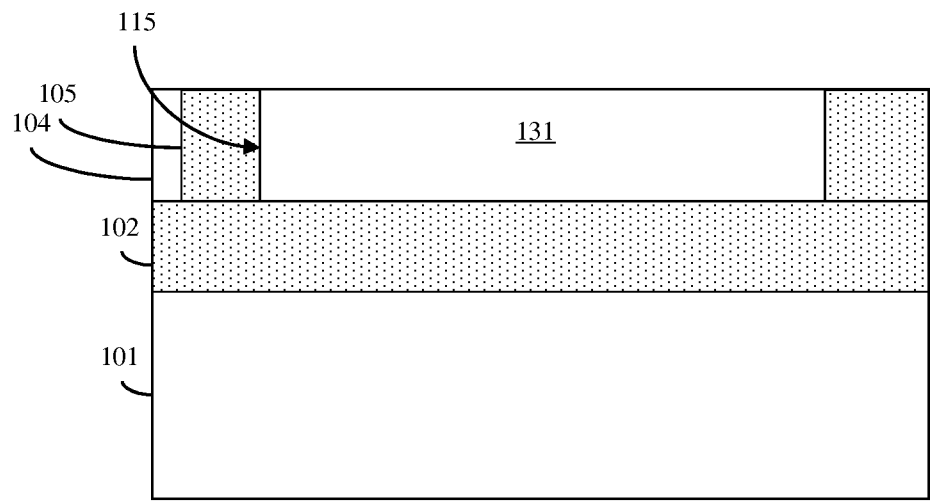
FIG. 26A is a cross-section diagram illustrating a partially completed SOI structure formed according to the method of FIG. 25.

Next, a shallow trench isolation (STI) region 105 can be formed in the semiconductor layer 104 in order to define an active region 115 of one or more semiconductor devices to be formed at process 2514, discussed in greater detail below (2504, see the cross section and top view diagrams of FIGS. 26A and 26B, respectively). This STI region 105 can be formed using conventional STI formation techniques. For example, a trench can be lithographically patterned and etched such that it extends vertically through the semiconductor layer 104 to the insulator layer 102 below and such that it defines boundaries of the active region 115. This trench can then be filled, for example, with one or more isolation materials (e.g., silicon oxide ($SiO_x$), silicon nitride ($SiN_x$), silicon oxynitride ($SiO_xN_y$) or any other suitable isolation material or combination thereof).

After the STI region 105 is formed at process 2504, one or more local heat dissipaters can be formed at predetermined locations on the SOI wafer 1300 (2506). To form the heat dissipater(s), the method can comprise forming, on opposing sides of the active region 115, openings 121 that extend through the STI region 105 and the insulator layer 102 to the semiconductor substrate 101 below (2507, see the cross section and top view diagrams respectively of FIGS. 26A and 26B). Formation of the opening(s) 121 can be accomplished using, for example, conventional lithographic patterning and etch processes. However, as discussed above with regard to FIGS. 14A-14C, the processes can be tailored so that the resulting opening(s) 121 each have an essentially uniform width or, alternatively, so that, within the insulator layer 102, the resulting opening(s) 121 each have a lower portion 211 adjacent to the semiconductor substrate 101 and having a first width 201 and an upper portion 212 above the lower portion 211 and having a second width 202 that is less than the first width 201.

Figure 28:
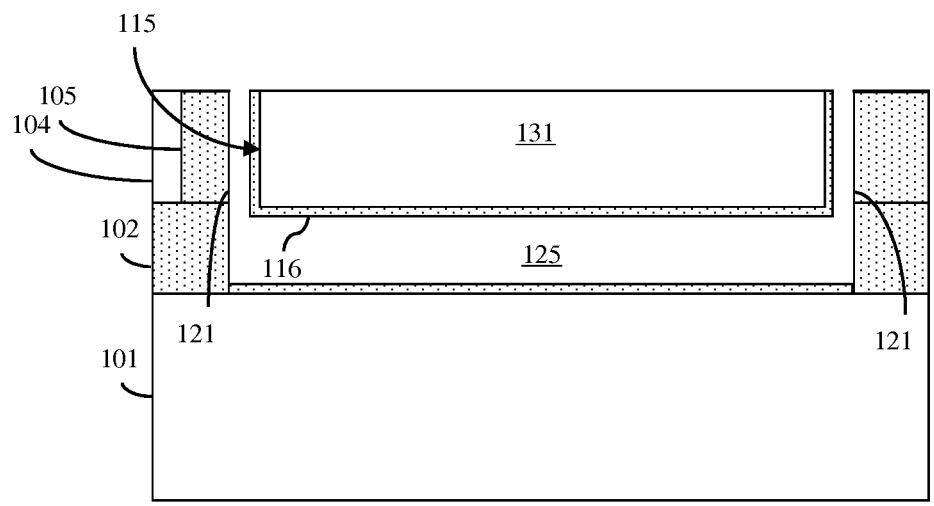
FIG. 28 is a cross-section diagram illustrating a partially completed SOI structure formed according to the method of FIG. 25.

Optionally, an additional etch process (e.g., a wet or dry isotropic etch process using a hydrofluoric acid (HF)-based chemistry) can be performed in order to create a cavity 125 within the insulator layer 102 between the two openings 121 and below the active region 115 (i.e., in order to merge the lower portions of the openings 121 below the active region, thereby forming a cavity 125) (2508, see FIG. 28). In this case, a relatively thin oxide layer 116 can also optionally be formed (e.g., by thermal oxidation) on the exposed surfaces of the active region 115 in order to prevent possible current leakage. As illustrated, such a thermal oxidation process may also result in a relatively thin oxide layer being formed on the exposed top surface of the substrate 101 within the cavity 125. Alternatively, a protective layer (e.g., a nitride layer or other suitable selective layer) can be formed on the exposed top surface of the substrate 101 within the cavity 125 prior to the thermal oxidation process and, then, subsequently removed (e.g., by a selective etch process) so that the thin oxide layer 116 is only on the exposed surfaces of the active region 115.

Figure 29A:
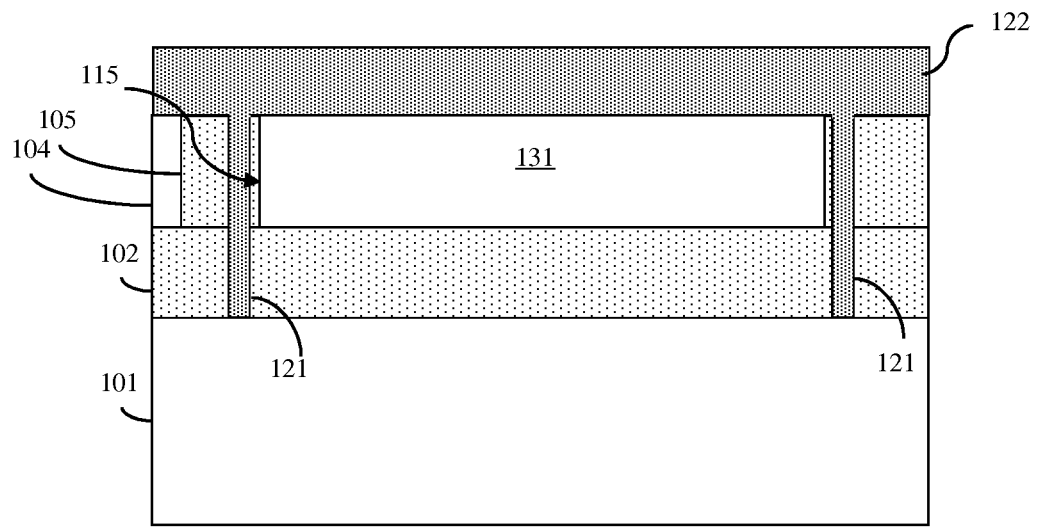
FIG. 29A is a cross-section diagram illustrating a partially completed SOI structure formed from the structure of FIG. 27A according to the method of FIG. 25.
Figure 29B:
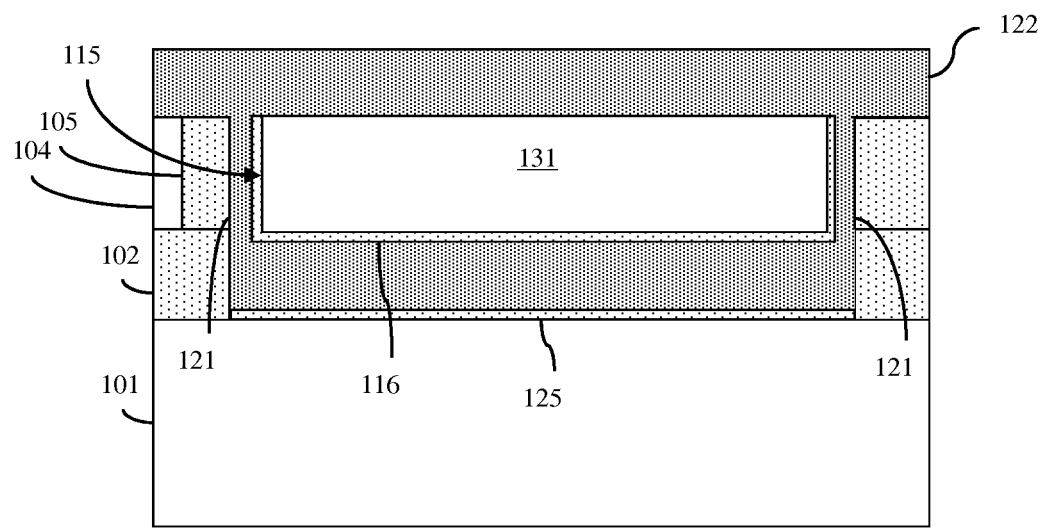
FIG. 29B is a cross-section diagram illustrating an alternative partially completed SOI structure formed from the structure 28 according to the method of FIG. 25.

After the opening(s) 121 are formed at process 2507 and the optional cavity 125 is formed at process 2508, a fill material 122 can be deposited into the opening(s) 121 such that the fill material 122 is immediately adjacent to the semiconductor substrate 101 and fills the openings 121 and, if applicable, the cavity 125 (2509, see FIGS. 29A and 29B). The fill material 122 can be preselected for its thermally conductive and electrically isolative properties. Specifically, the fill material 122 can be preselected such that it is more thermally conductive than the insulator layer 102. The fill material 122 can further be preselected such that it is electrically insulative (e.g., such that it has an electrical conductivity that is equivalently comparable to the insulator layer 102) and, thereby such that it is less electrically conductive than both the semiconductor layer 104 and the semiconductor substrate 101. Optionally, the fill material 122 can also be preselected such that it is more thermally conductive than the semiconductor substrate 101 and the semiconductor layer 104. For example, if the semiconductor substrate 101 and semiconductor layer 104 comprise silicon (Si) and the insulator layer 102 comprises silicon oxide ($SiO_2$), the fill material 122 can comprise aluminum nitride (AlN), aluminum oxide (AlO), beryllium oxide (BeO), sapphire and/or any other suitable thermally conductive, electrically isolative material. See also detailed discussion above regarding the table of FIG. 3.

Figure 30A:
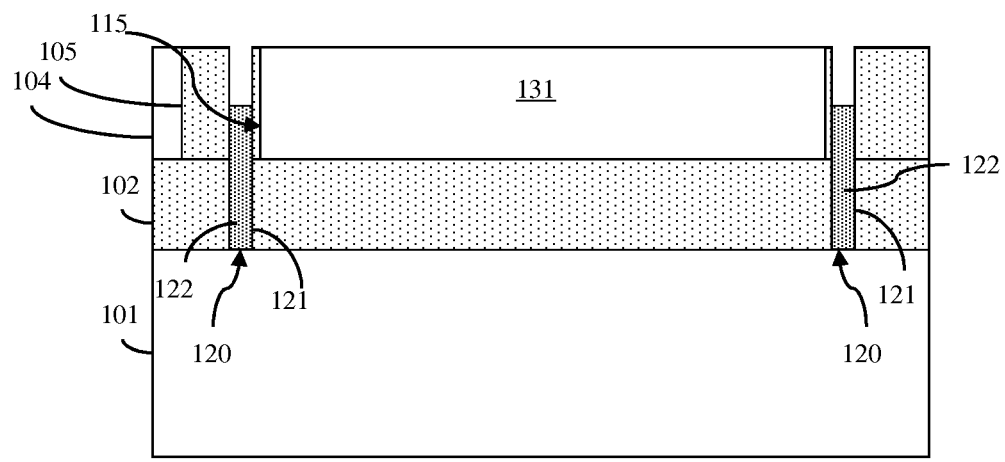
FIG. 30A is a cross-section diagram illustrating a partially completed SOI structure formed from the structure of FIG. 29A according to the method of FIG. 25.
Figure 30B:
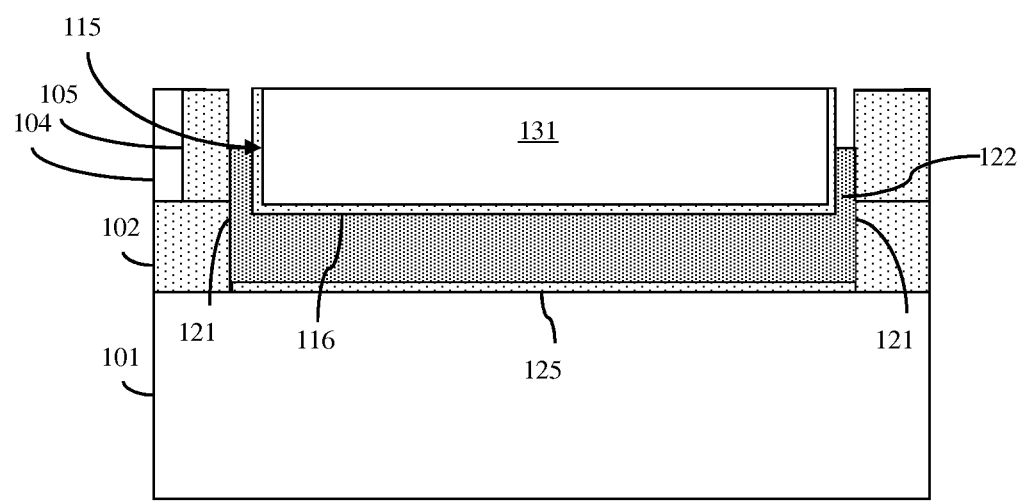
FIG. 30B is a cross-section diagram illustrating an alternative partially completed SOI structure formed from the structure 29B according to the method of FIG. 25.

After the fill material is deposited at process 2509, it can be etched back to a level at least below the top surface of the STI region 105 (e.g., to a level between the top surface of the STI region and the top surface of the insulator layer 102) (2510). It should be noted that, if a cavity is not formed below the active region 115 of the semiconductor device, deposition and etch back of the fill material 122 will create two discrete local heat dissipaters 120 positioned laterally adjacent and parallel to the active region 11 of the semiconductor device, as shown in FIG. 30A. However, if such a cavity 125 is formed below the active region 115, deposition and etch back of the fill material 122 will create a single, relatively large, local heat dissipater aligned below the active region 115 and, optionally, having vertical portions positioned parallel and adjacent to the active region 115, as shown in FIG. 30B.

Figure 31A:
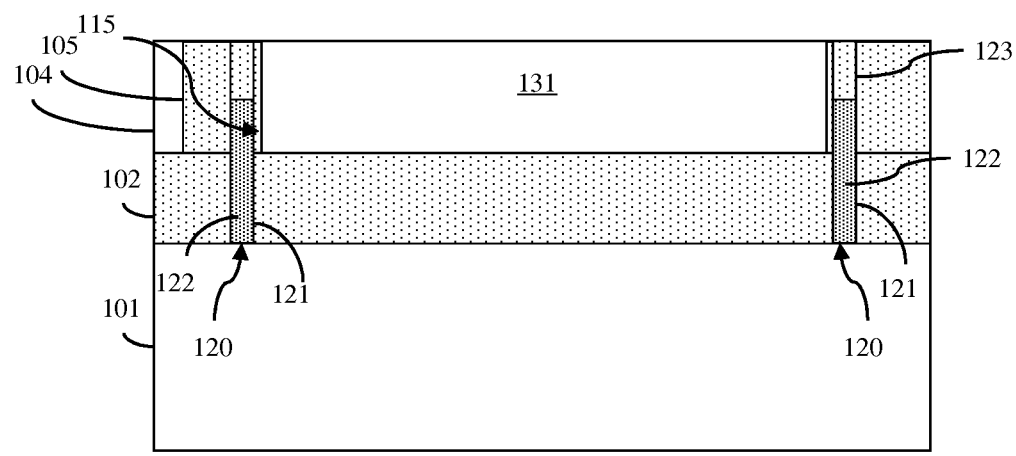
FIG. 31A is a cross-section diagram illustrating a partially completed SOI structure formed from the structure of FIG. 30A according to the method of FIG. 25.
Figure 31B:
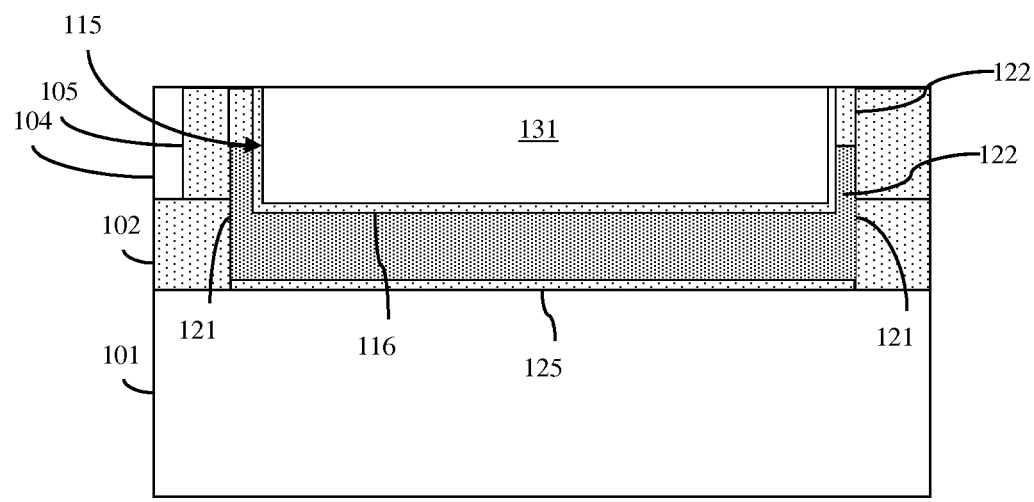
FIG. 31B is a cross-section diagram illustrating an alternative partially completed SOI structure formed from the structure 30B according to the method of FIG. 25.

In either case, following etch back of the fill material 122 at process 2510, additional isolation material 123 (e.g., additional silicon oxide material) can be deposited within the openings 121 on the fill material 122 in order to reconstruct the STI region 105 (2512, see FIGS. 31A and 31B).

Next, additional processing can be performed, as necessary, in order to form the semiconductor device having the active region 115 in the semiconductor layer 104 (2514). The semiconductor device 110 formed at process 2514 can comprise, for example, a metal oxide semiconductor field effect transistor (MOSFET), a junction field effect transistor (JFET), a bipolar junction transistor (BJT), a heterojunction bipolar transistor (HBT), a diode, or another semiconductor device. Various different techniques for forming such semiconductor devices and the specific components thereof are well known in the art. Thus, the details of these techniques have been omitted from this specification in order to allow the reader to focus on the salient aspects of the disclosed method.

Figure 26B:
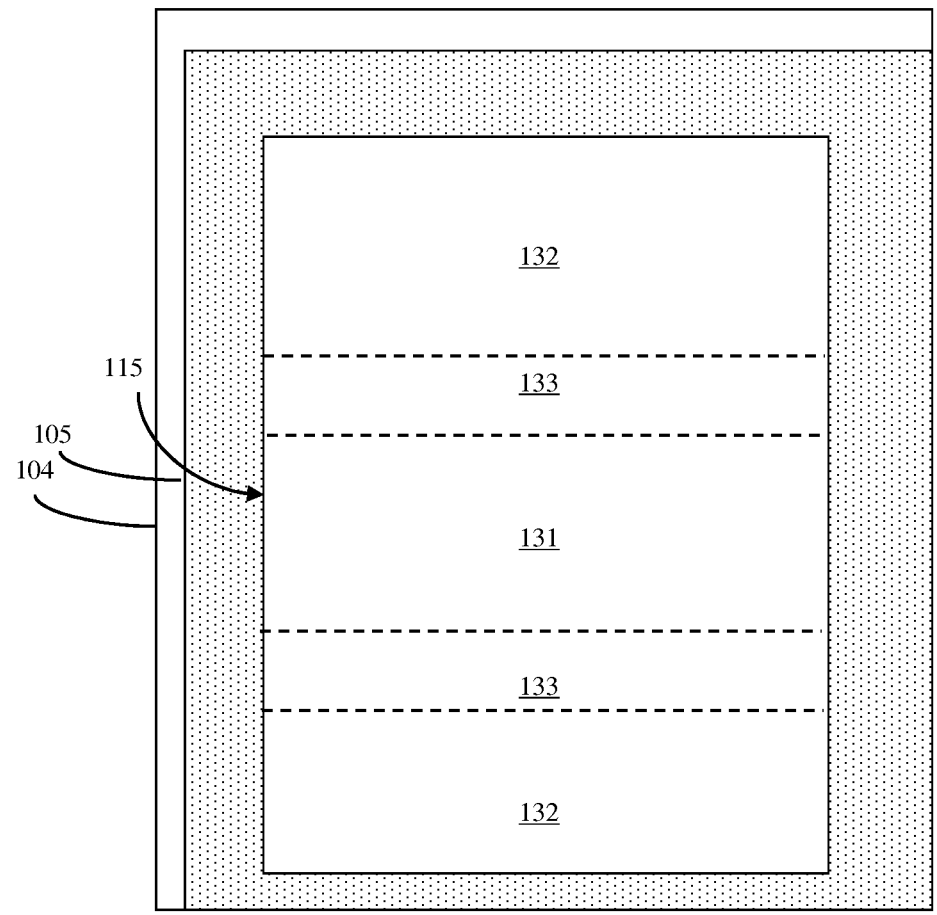
FIG. 26B is a to view diagram illustrating the partially completed SOI structure of FIG. 26A.
Figure 27A:
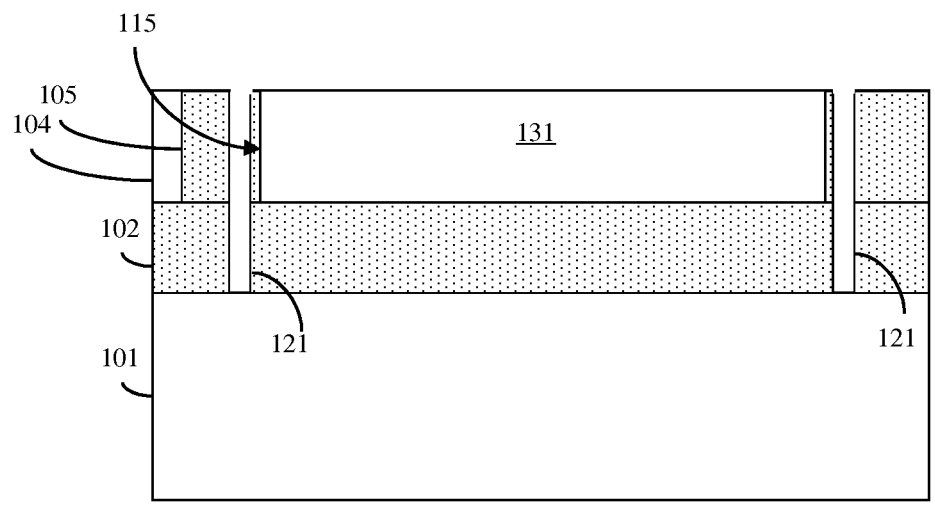
FIG. 27A is a cross-section diagram illustrating a partially completed SOI structure formed according to the method of FIG. 25.
Figure 27B:
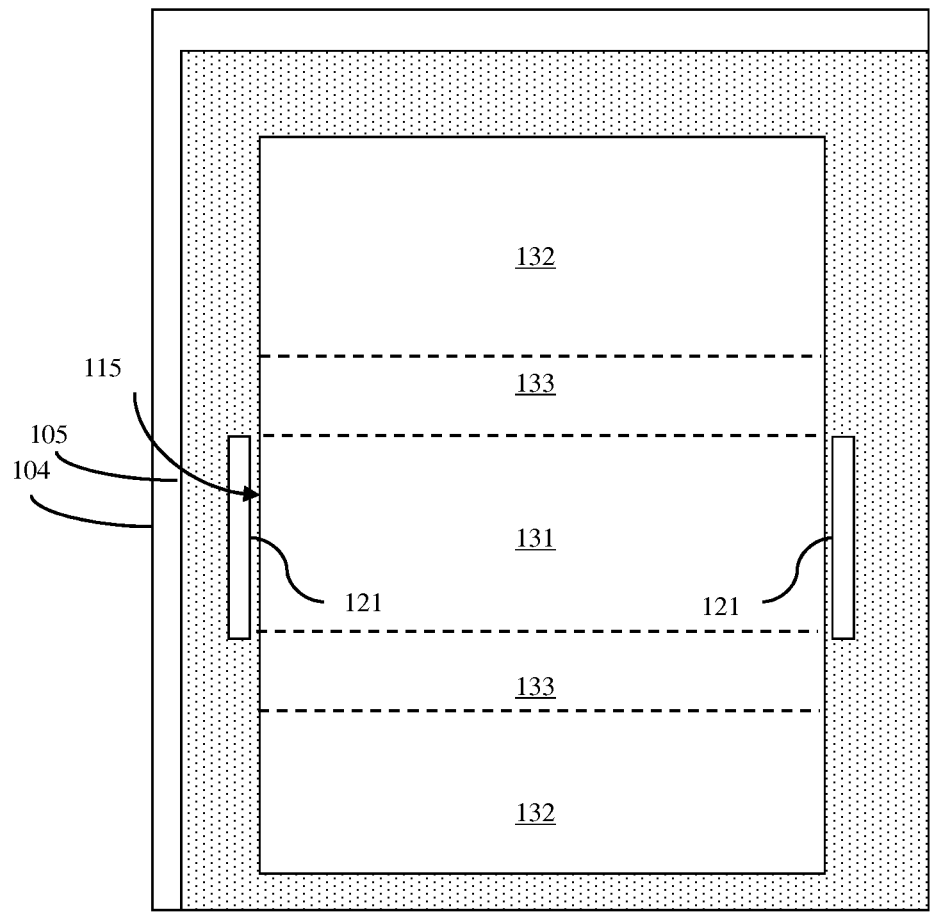
FIG. 27B is a to view diagram illustrating the partially completed SOI structure of FIG. 26A.

For example, in the case where the semiconductor device to be formed at process 2514 comprises a MOSFET, the active region 115 of the semiconductor device, as defined by the STI region 105 at process 2504, may have a center portion for a designated channel 131 positioned laterally between end portions for designated source/drain extensions 133 and source/drains 132 (see FIG. 26B). The openings 121 can be formed at process 2507 through the STI region 105 such that they are positioned laterally adjacent and parallel to the center portion (i.e., the designated channel 131) of the active region 115 (see FIGS. 27A-27B). The fill material 122 can subsequently be deposited in the openings 121 at process 2509 (see FIG. 29A) and then etched back to a level between the top surface of the STI region 105 and the top surface of the insulator layer 102 at process 2510, thereby creating two local heat dissipaters 120 on opposing sides of the channel 131 (see FIG. 30A). After the fill material 122 is etched back at process 2510, additional isolation material 123 can be deposited within the openings 121 on the fill material 122 at process 2512 in order to reconstruct the STI region 105 (see FIG. 31A). Then, additional processing can be performed at process 2504, as necessary, in order to form the MOSFET structure 100F, as shown in FIG. 1F and described in detail above.

In another example, where the semiconductor device 110 to be formed at process 2514 comprises a MOSFET, the active region 115 of the semiconductor device, as defined by the STI region 105 at process 2504, may similarly have center portion for a designated channel 131 positioned laterally between end portions for designated source/drain extensions 133 and source/drains 132 (see FIG. 26B). The openings 121 can be formed at process 2507 through the STI region 105 such that they are positioned laterally adjacent and parallel to the center portion (i.e., the designated channel 131) of the active region 115 (see FIGS. 27A-27B). An additional etch process can be performed at process 2508 in order to create a cavity 125 within the insulator layer between the two openings 121 and below the center portion (i.e., below the designated channel 131) of the active region 115 and, optionally, an oxide layer 116 can be formed (e.g., on the exposed surfaces of the active region 115 (see FIG. 28). The fill material 122 can subsequently be deposited in the openings 121 at process 2509 so as to fill the cavity 125 (see FIG. 29B) and can then be etched back at process 2510 to a level between the top surface of the STI region 105 and the top surface of the insulator layer 102, thereby creating a single, relatively large, local heat dissipater 120 aligned below the center portion (i.e., the designated channel 131) of the active region 115 (see FIG. 30B). After the fill material 122 is etched back, additional isolation material 123 can be deposited within the openings 121 on the fill material 122 in order to reconstruct the STI region 105 (see FIG. 31B). Then, additional processing can be performed at process 2504, as necessary, in order to form a MOSFET structure that is similar to the MOSFET structure 100D of FIG. 1D, described in detail above.

Thus, in the various methods described above, the configuration of the local heat dissipater(s) 120 including, but not limited to, the dimensions (i.e., size, shape, etc.) of the opening(s) 121 that are formed, the locations of the opening(s) 121 of the opening(s) 121 and the type of material used to fill the opening(s) 121 can be predetermined in order to maximize dissipation of heat generated by the semiconductor device 110, to minimize current leakage between the semiconductor device 110 and the semiconductor substrate 101 and to selectively adjust (i.e., tune) capacitance coupling between the components (e.g., the source/drain extensions 133, the source/drains 132, and/or the channel 131) in the active region 115 of the semiconductor device 110 and the semiconductor substrate 101.

It should be noted that, for purposes of illustration, the disclosed methods and systems have been described with respect to application specific integrated circuit (ASIC) design techniques; however, it is anticipated that these methods and system could be implemented in any other suitable integrated circuit design technique. It should also be noted that the terminology used herein is for the purpose of describing the system, method and computer program product and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

Therefore, disclosed above are semiconductor-on-insulator (SOI) structures comprising an SOI device (e.g., an SOI metal oxide semiconductor field effect transistor (MOSFET) or other SOI device) with one or more local heat dissipaters (also referred to herein as thermal vias (TVs)). Each local heat dissipater can comprise an opening, which is adjacent to an active region of the SOI device, which extends through the insulator layer on which the SOI device sits to the semiconductor substrate below, and which is at least partially filled with a pre-selected fill material. This fill material can be a thermal conductor so as to dissipate heat generated by the SOI device into the semiconductor substrate in order to passively cool the SOI device. The fill material can further be an electrical isolator so as to minimize current leakage from the SOI device to the semiconductor substrate. In the case of a MOSFET, the local heat dissipater(s) can be aligned below the source/drain extension(s) or the source/drain(s) of the MOSFET. Alternatively, the local heat dissipater(s) can be aligned below the channel of the MOSFET or parallel and adjacent to side(s) of the channel of the MOSFET. Also disclosed herein are methods of forming these SOI structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor-on-insulator (SOI) structure comprising:
   a semiconductor substrate;
   an insulator layer on and immediately adjacent to said semiconductor substrate;
   a semiconductor layer on and immediately adjacent to said insulator layer, said semiconductor layer comprising an active region of a semiconductor device; and
   a local heat dissipater comprising:
      an opening extending vertically through said insulator layer from said semiconductor layer to said semiconductor substrate, said opening being aligned below said active region; and
      a fill material filling said opening so as to be immediately adjacent to said active region in said semiconductor layer and further so as to be immediately adjacent to said semiconductor substrate,
      said fill material comprising an electrically insulative material such that said fill material and said insulator layer electrically isolate said semiconductor layer from said semiconductor substrate, and
      said fill material being more thermally conductive than said insulator layer such that said fill material dissipates heat from said active region into said semiconductor substrate.

2. The semiconductor-on-insulator (SOI) structure of claim 1, said fill material further being less electrically conductive than said semiconductor substrate and more thermally conductive and less electrically conductive than said semiconductor layer.

3. The semiconductor-on-insulator (SOI) structure of claim 1, said semiconductor device comprising a field effect transistor and said heat dissipater being any one of aligned below a source/drain extension within said active region, aligned below a source/drain within said active region, and aligned below a channel within said active region.

4. The semiconductor-on-insulator (SOI) structure of claim 1, further comprising a shallow trench isolation region above said insulator layer and positioned laterally around said active region,
   said semiconductor device comprising a field effect transistor,
   said active region comprising a channel positioned laterally between source/drain regions, and
   said opening further extending through said shallow trench isolation region and said insulator layer such that said heat dissipater is parallel to and positioned laterally adjacent to said channel within said active region.

5. The semiconductor-on-insulator (SOI) structure of claim 1, said opening having an essentially uniform width.

6. The semiconductor-on-insulator (SOI) structure of claim 1, said opening having a lower portion and an upper portion, said lower portion being wider than said lower portion.

7. A method of forming a semiconductor-on-insulator (SOI) structure, said method comprising:

forming an insulator layer on and immediately adjacent to a semiconductor substrate;
forming a local heat dissipater in said insulator layer, said forming of said local heat dissipater comprising:
  forming an opening extending vertically through said insulator layer to said semiconductor substrate;
  depositing a fill material in said opening such that said fill material is immediately adjacent to said semiconductor substrate;
  after said forming of said local heat dissipater, forming a semiconductor layer on and immediately adjacent to said insulator layer and said fill material within said opening; and
  forming a semiconductor device having an active region in said semiconductor layer, said active region being aligned above and immediately adjacent to said local heat dissipater,
said fill material comprising an electrically insulative material such that said fill material and said insulator layer electrically isolate said semiconductor layer from said semiconductor substrate, and
said fill material further being more thermally conductive than said insulator layer such that said fill material dissipates heat from said active region into said semiconductor substrate.

8. The method of claim 7, said fill material further being less electrically conductive than said semiconductor substrate and more thermally conductive and less electrically conductive than said semiconductor layer.

9. The method of claim 7,
  said semiconductor device comprising a field effect transistor, and
  said forming of said semiconductor device and said forming of said local heat dissipater being performed such that said local heat dissipater is any one of aligned below a source/drain extension within said active region, aligned below a source/drain within said active region, and aligned below a channel within said active region.

10. The method of claim 7, said forming of said opening being performed such that said opening has an essentially uniform width.

11. The method of claim 7, said forming of said opening being performed such that said opening has a lower portion and an upper portion, said lower portion being wider than said lower portion.

12. A method of forming a semiconductor-on-insulator (SOI) structure, said method comprising:
  providing a semiconductor-on-insulator wafer comprising:
    a semiconductor substrate;
    an insulator layer on and immediately adjacent to said semiconductor substrate; and
    a semiconductor layer on and immediately adjacent to said insulator layer;
  forming a local heat dissipater, said forming of said local heat dissipater comprising:
    forming an opening extending vertically through said semiconductor layer and said insulator layer to said semiconductor substrate;
    depositing a fill material into said opening immediately adjacent to said semiconductor substrate;
    etching back said fill material to at least level with a top surface of said insulator layer; and
  depositing additional semiconductor material within said opening on said fill material; and
  any one of before said forming of said local heat dissipater and after said forming of said local heat dissipater, forming a semiconductor device having an active region in said semiconductor layer such that, within said semiconductor-on-insulator (SOI) structure, said local heat dissipater is aligned below and immediately adjacent to said active region,
said fill material comprising an electrically insulative material such that said fill material and said insulator layer electrically isolate said semiconductor layer and said additional semiconductor material from said semiconductor substrate, and
said fill material further being more thermally conductive than said insulator layer such that said fill material dissipates heat from said active region into said semiconductor substrate.

13. The method of claim 12, said fill material further being less electrically conductive than said semiconductor substrate and more thermally conductive and less electrically conductive than said semiconductor layer.

14. The method of claim 12,
  said semiconductor device comprising a field effect transistor, and
  said forming of said semiconductor device and said forming of said local heat dissipater being performed such that said local heat dissipater is any one of aligned below a source/drain extension within said active region, aligned below a source/drain within said active region, and aligned below a channel within said active region.

15. The method of claim 12, said forming of said opening being performed such that said opening has an essentially uniform width.

16. The method of claim 12, said forming of said opening being performed such that said opening has a lower portion and an upper portion, said lower portion being wider than said lower portion.

17. A method of forming a semiconductor-on-insulator (SOI) structure, said method comprising:
  providing a semiconductor-on-insulator wafer comprising:
    a semiconductor substrate;
    an insulator layer on and immediately adjacent to said semiconductor substrate; and
    a semiconductor layer on and immediately adjacent to said insulator layer;
  forming a shallow trench isolation region extending vertically through said semiconductor layer to said insulator layer and defining an active region for a semiconductor device within said semiconductor layer;
  forming at least one local heat dissipater, said forming of said at least one local heat dissipater comprising:
    forming, on opposing sides of said active region, openings extending vertically through said shallow trench isolation region and said insulator layer to said semiconductor substrate; and
    depositing a fill material in said openings such that said fill material is immediately adjacent to said semiconductor substrate; and
    etching said fill material to a level between a top surface and a bottom surface of said shallow trench isolation region such that at least an upper portion of said fill material in each of said openings is positioned laterally adjacent to said active region,
said fill material comprising an electrically insulative material such that said shallow trench isolation region, said fill material and said insulator layer electrically isolate said semiconductor layer from said semiconductor substrate, and
said fill material further being more thermally conductive than said shallow trench isolation region and said insulator layer such that said fill material dissipates heat from said active region into said semiconductor substrate.

18. The method of claim 17, said fill material further being less electrically conductive than said semiconductor substrate and more thermally conductive and less electrically conductive than said semiconductor layer.

19. The method of claim 17,
said semiconductor device comprising a field effect transistor,
said active region comprising a channel,
said forming of said openings comprising forming said openings through said shallow trench isolation region such that said openings are parallel and adjacent to said channel,
said method further comprising, after said forming of said openings, performing an isotropic etch process to form a cavity below said channel
said depositing of said fill material filling said cavity,
said etching of said fill material comprising etching said fill material to below said level of said top surface of said shallow trench isolation region, and
said method further comprising, after said etching, depositing additional isolation material within said openings on said fill material.

20. The method of claim 17,
said semiconductor device comprising a field effect transistor,
said active region comprising a channel,
said forming of said openings comprising forming said openings through said shallow trench isolation region such that said openings are parallel and adjacent to said channel,
said etching of said fill material comprising etching said fill material to below said level of said top surface of said shallow trench isolation region, and
said method further comprising, after said etching, depositing additional isolation material within said openings on said fill material.

21. The method of claim 20, said forming of said openings being performed such that said openings have an essentially uniform width.

22. The method of claim 20, said forming of said openings being performed such that said openings have a lower portion and an upper portion, said lower portion being wider than said lower portion.

* * * * *